United States Patent
Deng et al.

(10) Patent No.: US 12,347,083 B2
(45) Date of Patent: Jul. 1, 2025

(54) AREA SELECTION IN CHARGED PARTICLE MICROSCOPE IMAGING

(71) Applicant: FEI Company, Hillsboro, OR (US)

(72) Inventors: Yuchen Deng, Eindhoven (NL); Holger Kohr, Eindhoven (NL); Maurice Peemen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 629 days.

(21) Appl. No.: 17/358,928

(22) Filed: Jun. 25, 2021

(65) Prior Publication Data

US 2022/0414855 A1    Dec. 29, 2022

(51) Int. Cl.
G06T 7/00     (2017.01)
G06F 18/214   (2023.01)
(Continued)

(52) U.S. Cl.
CPC ........ G06T 7/0002 (2013.01); G06F 18/2148 (2023.01); G06T 7/11 (2017.01);
(Continued)

(58) Field of Classification Search
CPC .......... G06N 3/08; G06N 20/00; G06N 3/045; G06N 3/09; G06N 20/10; G06N 3/048; G06N 10/60; G06N 5/043; G06N 20/20; G06N 3/084; G06N 5/01; G06N 5/022; G06N 7/01; G06N 3/044; G06N 3/088; G06N 3/0464; G06N 10/80; G06N 3/0455;
(Continued)

(56) References Cited

U.S. PATENT DOCUMENTS

2018/0144466 A1*  5/2018  Hsieh ................. G06N 3/08
2018/0259536 A1*  9/2018  Short ................. G01N 33/543
(Continued)

FOREIGN PATENT DOCUMENTS

WO    2020035285 A1    2/2020
WO    2021052918 A1    3/2021

OTHER PUBLICATIONS

Rizk, A., Paul, G., Incardona, P. et al. Segmentation and quantification of subcellular structures in fluorescence microscopy images using Squassh. Nat Protoc 9, 586-596 (2014) (Year: 2014).*
(Continued)

*Primary Examiner* — Alex Kok S Liew

(57) ABSTRACT

Disclosed herein are apparatuses, systems, methods, and computer-readable media relating to area selection in charged particle microscope (CPM) imaging. For example, in some embodiments, a CPM support apparatus may include: first logic to generate a first data set associated with an area of a specimen by processing data from a first imaging round of the area by a CPM; second logic to generate predicted parameters of the area; and third logic to determine whether a second imaging round of the area is to be performed by the CPM based on the predicted parameters of the area; wherein the first logic is to, in response to a determination by the third logic that a second imaging round of the area is to be performed, generate a second data set, including measured parameters, associated with the area by processing data from a second imaging round of the area by the CPM.

21 Claims, 5 Drawing Sheets

(51) Int. Cl.

| | |
|---|---|
| *G06T 7/11* | (2017.01) |
| *G06T 7/73* | (2017.01) |
| *G06V 20/69* | (2022.01) |
| *H01J 37/22* | (2006.01) |
| *H01J 37/26* | (2006.01) |
| *G06V 10/22* | (2022.01) |

(52) U.S. Cl.
CPC .............. *G06T 7/73* (2017.01); *G06V 20/698* (2022.01); *H01J 37/222* (2013.01); *H01J 37/265* (2013.01); *G06T 2200/21* (2013.01); *G06T 2207/10056* (2013.01); *G06T 2207/20016* (2013.01); *G06T 2207/20081* (2013.01); *G06T 2207/30168* (2013.01); *G06T 2207/30242* (2013.01); *G06V 10/22* (2022.01)

(58) Field of Classification Search
CPC ........ G06N 3/091; G06N 5/046; G06N 10/40; G06N 3/043; G06N 3/0442; G06N 3/047; G06N 3/0475; G06N 3/049; G06N 3/0495; G06N 3/086; G06N 3/0895; G06N 3/092; G06N 3/126; G06N 5/025; G06N 5/045; G06N 3/04; G06N 3/02; G06N 3/096; G06N 5/04; G06N 3/042; G06N 3/063; G06N 3/098; G06N 3/0985
See application file for complete search history.

(56) References Cited

U.S. PATENT DOCUMENTS

2020/0357097 A1\* 11/2020 Peemen ................. G06T 5/002
2021/0321963 A1\* 10/2021 Manor .................... G06T 11/00
2021/0407654 A1\* 12/2021 Ohashi ................. G06T 7/0014

OTHER PUBLICATIONS

Advances in Single Particle Analysis Data Acquisition, Stan Konings, Maarten Kuijper, Jeroen Keizer, Fanis Grollios, Tjerk Spanjer, Peter Tiemeijer, Microsc. Microanal. 25 (Supp 2) 2019, pp. 1012-1013, Microscopy Society of America.

Real-time object locator for cryo-EM data collection, Koji Yonekura, Saori Maki-Yonekura, Hisashi Naitow, Tasuku Hamaguchi and Kiyofumi Takaba, https://www.biorxiv.org/content/10.1101/2021.04.07.438905v1, posted Apr. 9, 2021, retrieved Jun. 24, 2021.

Structural Analysis of Protein Complexes by Cryo Electron Microscopy, Tiago R.D. Costa, Athanasios Ignatiou and Elena V. Orlova, Bacterial Protein Secretion Systems: Methods and Protocols, Methods in Molecular Biology, pp. 377-413, vol. 1615, DOI 10.1007/978-1-4939-7033-9_28, Springer Science+Business Media LLC 2017.

Extended European Search Report dated Nov. 11, 2022, mailed to EP Patent Application No. 22180665.6.

\* cited by examiner

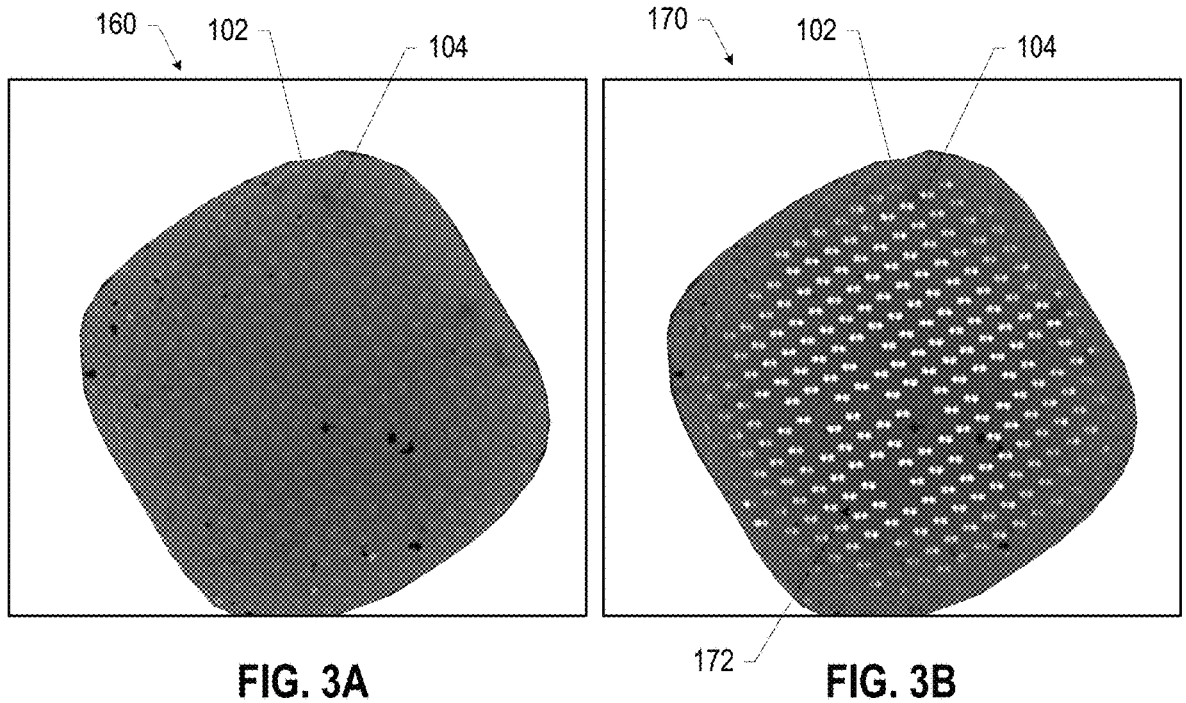
FIG. 3A      FIG. 3B
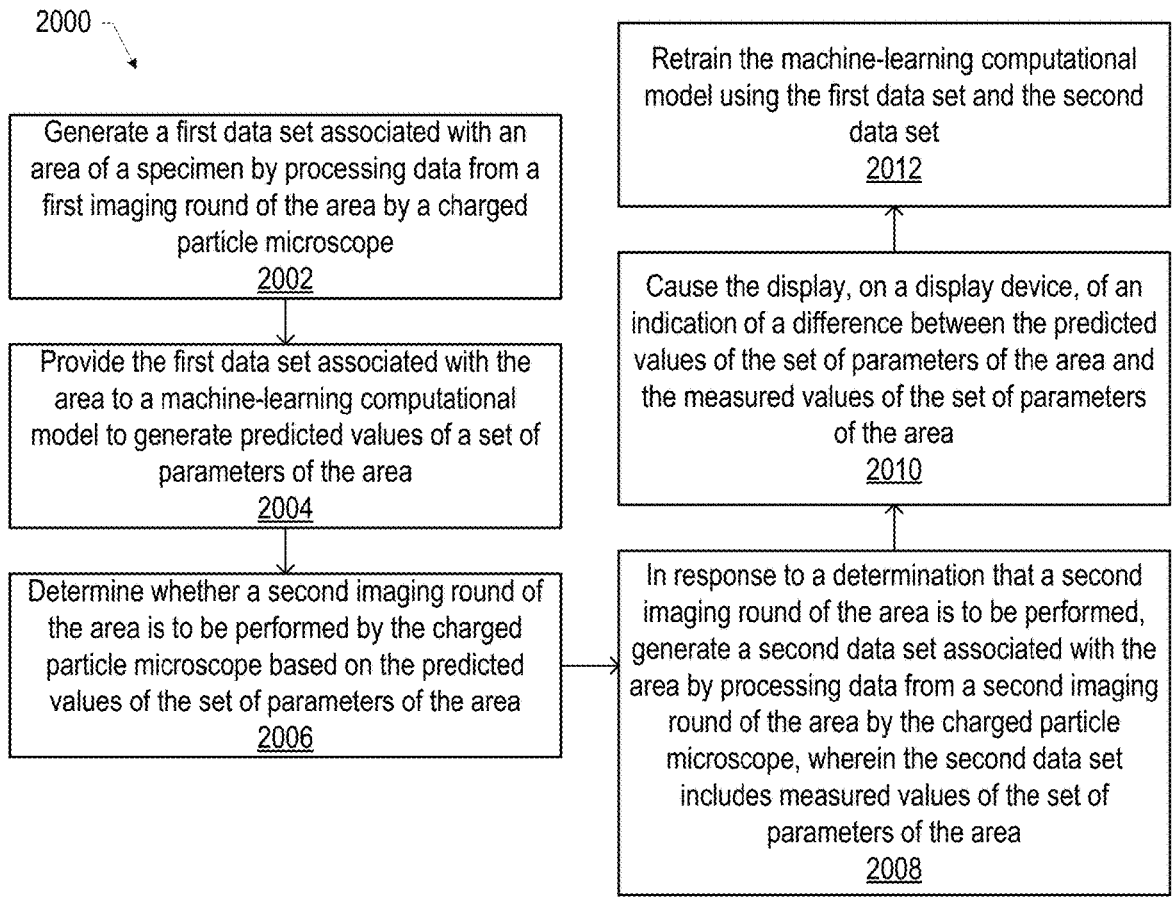
FIG. 4

AREA SELECTION IN CHARGED PARTICLE MICROSCOPE IMAGING

BACKGROUND

Microscopy is the technical field of using microscopes to better view objects that are difficult to see with the naked eye. Different branches of microscopy include, for example, optical microscopy, charged particle (e.g., electron and/or ion) microscopy, and scanning probe microscopy. Charged particle microscopy involves using a beam of accelerated charged particles as a source of illumination. Types of charged particle microscopy include, for example, transmission electron microscopy, scanning electron microscopy, scanning transmission electron microscopy, and ion beam microscopy.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 3A and 3B are graphical representations that may be provided to a user, via a display device, as part of the area selection techniques disclosed herein, in accordance with various embodiments.

FIG. 4 and FIG. 5 are flow diagrams of example methods of area selection in CPM imaging, in accordance with various embodiments.

DETAILED DESCRIPTION

Figure 1:
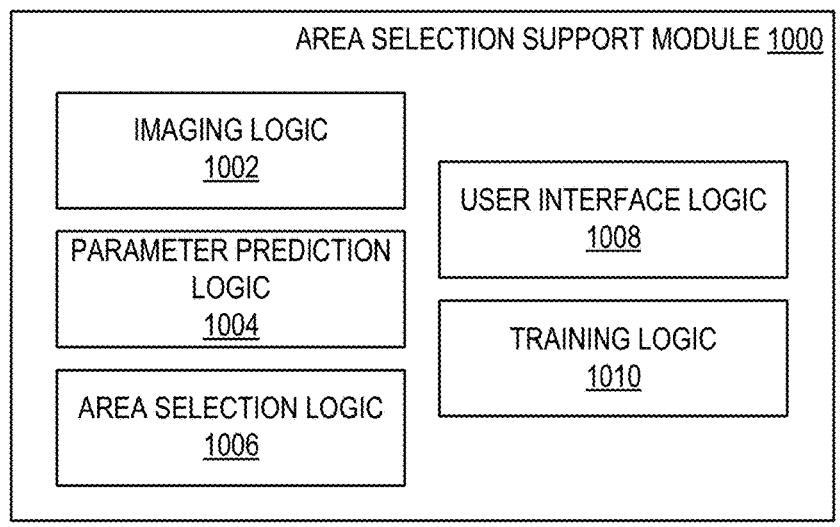
FIG. 1 is a block diagram of an example CPM support module for performing charged particle microscope (CPM) imaging support operations, in accordance with various embodiments.

Disclosed herein are apparatuses, systems, methods, and computer-readable media relating to area selection in charged particle microscope (CPM) imaging. For example, in some embodiments, a CPM support apparatus may include: first logic to generate a first data set associated with an area of a specimen by processing data from a first imaging round of the area by a CPM; second logic to generate predicted parameters of the area; and third logic to determine whether a second imaging round of the area is to be performed by the CPM based on the predicted parameters of the area; wherein the first logic is to, in response to a determination by the third logic that a second imaging round of the area is to be performed, generate a second data set, including measured parameters, associated with the area by processing data from a second imaging round of the area by the CPM.

The CPM support embodiments disclosed herein may achieve improved performance relative to conventional approaches. For example, conventional CPM requires an extensive amount of manual intervention by expert users to select areas-of-interest for detailed imaging. Thus, despite advances in CPM technology, the overall throughput of a CPM system has remained stagnant. The CPM support embodiments disclosed herein may predict "high-resolution" information about an area of a specimen based on a "low-resolution" imaging round, and thus may increase the throughput of CPM imaging relative to conventional approaches, and may also reduce the radiation damage to the specimen under study. The embodiments disclosed herein may be readily applied to a number of imaging applications, such as cryo-electron microscopy (cryo-EM), micro-crystal electron diffraction (MED), and tomography. The embodiments disclosed herein thus provide improvements to CPM technology (e.g., improvements in the computer technology supporting such CPMs, among other improvements).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). Although some elements may be referred to in the singular (e.g., "a processing device"), any appropriate elements may be represented by multiple instances of that element, and vice versa. For example, a set of operations described as performed by a processing device may be implemented with different ones of the operations performed by different processing devices.

The description uses the phrases "an embodiment," "various embodiments," and "some embodiments," each of which may refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, an "apparatus" may refer to any individual device, collection of devices, part of a device, or collections of parts of devices. The drawings are not necessarily to scale.

FIG. 1 is a block diagram of a CPM support module 1000 for performing support operations, in accordance with various embodiments. The CPM support module 1000 may be implemented by circuitry (e.g., including electrical and/or optical components), such as a programmed computing device. The logic of the CPM support module 1000 may be included in a single computing device, or may be distributed across multiple computing devices that are in communication with each other as appropriate. Examples of computing devices that may, singly or in combination, implement the CPM support module 1000 are discussed herein with reference to the computing device 4000 of FIG. 8, and examples of systems of interconnected computing devices, in which the CPM support module 1000 may be implemented across one or more of the computing devices, is discussed herein with reference to the CPM support system 5000 of FIG. 9. The CPM whose operations are supported by the CPM support module 1000 may include any suitable type of CPM, such as a scanning electron microscope (SEM), a transmission electron microscope (TEM), a scanning transmission electron microscope (STEM), or an ion beam microscope.

The CPM support module 1000 may include imaging logic 1002, parameter prediction logic 1004, area selection logic 1006, user interface logic 1008, and training logic 1010. As used herein, the term "logic" may include an apparatus that is to perform a set of operations associated with the logic. For example, any of the logic elements included in the CPM support module 1000 may be implemented by one or more computing devices programmed with instructions to cause one or more processing devices of the computing devices to perform the associated set of operations. In a particular embodiment, a logic element may include one or more non-transitory computer-readable media having instructions thereon that, when executed by one or more processing devices of one or more computing devices, cause the one or more computing devices to perform the associated set of operations. As used herein, the term "module" may refer to a collection of one or more logic elements that, together, perform a function associated with the module. Different ones of the logic elements in a module may take the same form or may take different forms. For example, some logic in a module may be implemented by a programmed general-purpose processing device, while other logic in a module may be implemented by an application-specific integrated circuit (ASIC). In another example, different ones of the logic elements in a module may be associated with different sets of instructions executed by one or more processing devices. A module may not include all of the logic elements depicted in the associated drawing; for example, a module may include a subset of the logic elements depicted in the associated drawing when that module is to perform a subset of the operations discussed herein with reference to that module. In some embodiments, different ones of the logic elements in a module may utilize shared elements (e.g., shared programmed instructions and/or shared circuitry).

The imaging logic 1002 may be configured to generate data sets associated with an area of the specimen by processing data from an imaging round of the area by a CPM (e.g., the CPM 5010 discussed below with reference to FIG. 9). In some embodiments, the imaging logic 1002 may cause a CPM to perform one or more imaging rounds of an area of a specimen.

Figure 2:
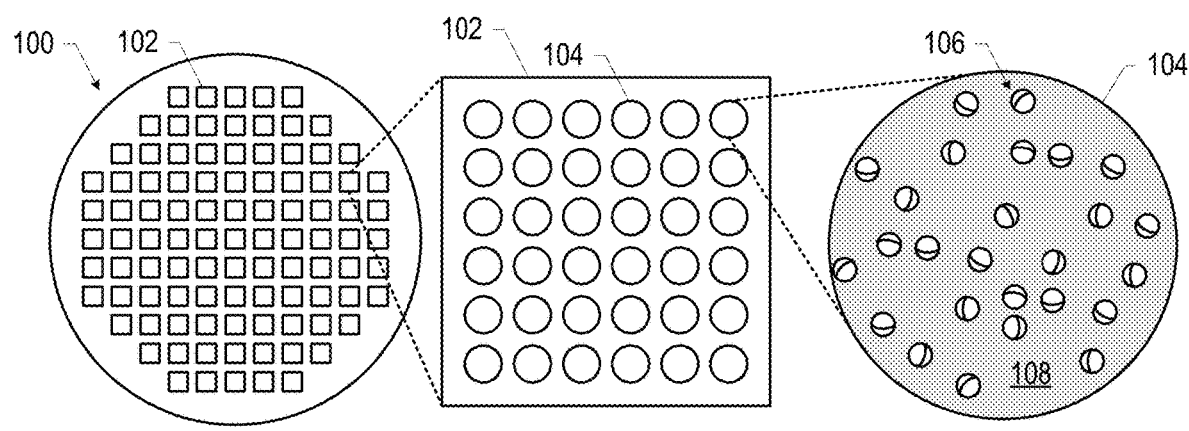
FIG. 2 illustrates an example specimen that may be imaged by a CPM by the area selection techniques disclosed herein, in accordance with various embodiments.

In some embodiments, the imaging logic 1002 may be configured for cryo-electron microscopy (cryo-EM), and the specimen may be a cryo-EM sample like the cryo-EM sample 100 illustrated in FIG. 2. The cryoEM sample 100 of FIG. 2 may include a copper mesh grid (e.g., having a diameter between 1 millimeter and 10 millimeters) having square patches 102 of carbon thereon. The carbon of the patches 102 may include regular holes 104 e.g., having a diameter between 1 micron and 5 microns), and the holes 104 may have a thin layer of super-cooled ice 108 therein, in which elements-of-interest 106 (e.g., particles, such as protein molecules or other biomolecules) are embedded. In some embodiments, each of the holes 104 may serve as a different area to be analyzed by the CPM support module 1000 (e.g., to select the "best" one or more holes 104 in which to further investigate the elements-of-interest 106, as discussed below). This particular example of a specimen is simply illustrative, and any suitable specimen for a particular CPM may be used.

In some embodiments, the imaging logic 1002 may be configured to generate a first data set associated with an area of the specimen by processing data from a first imaging round of the area by a CPM, and may also generate a second data set associated with the area of the specimen by processing data from a second imaging round of the area by the CPM (e.g., when that area is selected for multiple rounds of imaging, as discussed below with reference to the parameter prediction logic 1004 and the area selection logic 1006). For ease of illustration, an "initial" data set generated by the imaging logic 1002 for use by the parameter prediction logic 1004 may be referred to herein as a "first data set," and a "subsequent" data set generated by the imaging logic 1002 (after an area is selected for additional imaging by the area selection logic 1006) may be referred to herein as a "second data set." For a particular area of a specimen, the first data set may have a lower resolution than the second data set, the acquisition time for the first imaging round associated with the first data set may be less than the acquisition time for the second imaging round associated with the second data set, and/or the radiation dose delivered to the specimen in the first imaging round associated with the first data set may be less than the radiation dose delivered to the specimen in the second imaging round associated with the second data set. The imaging logic 1002 may generate first data sets for multiple different areas of a specimen, and for some of these multiple different areas, may also generate second data sets.

In some embodiments, the imaging logic 1002 may generate a data set (e.g., a first data set and/or a second data set) by processing the output of the CPM from an imaging round by performing any of a number of processing operations, such as filtering, aligning, or other known operations. The second data set generated by the imaging logic 1002 for a particular area of a specimen may include measured values of a set of parameters of the area. In some embodiments, a "set of parameters" may include a single parameter, while in other embodiments, a "set of parameters" may include multiple parameters. A set of parameters of an area may include at least one data quality indicator, a measurement indicative of the likelihood of obtaining high quality information about particles or other elements-of-interest of the specimen in the area by further investigating the area. Thus, a data quality indicator may indicate, to a user of a CPM, the likelihood that further investigation of the associated area of the specimen will yield "good" results. In some embodiments in which a specimen includes particles or other elements-of-interest in ice (e.g., for cryo-electron microscopy applications), one of the parameters of an area (e.g., a data quality indicator) may include the thickness of the ice in that area. In some embodiments, the parameters of an area may include a count of elements of interest in the area, a level of contamination in the area, an amount of specimen movement in the area, an amount of specimen degradation in the area, or an orientation distribution of elements-of-interest in the area. Any of these parameters may be measured by performance of a second imaging round by a CPM, and the measured values of these parameters may be included in the second data set associated with an area.

The parameter prediction logic 1004 may provide a first data set (e.g., arising from a "low-resolution," "low acquisition time," and/or "low radiation dose" imaging round) associated with an area of a specimen, generated by the imaging logic 1002, to a machine-learning computational model that is to output predicted values of the set of parameters of the area of the specimen. The set of parameters whose predicted values may be generated by the machine-learning computational model of the parameter prediction logic 1004 may be the same set of parameters whose measured values may be generated by the imaging logic 1002 in a second data set (e.g., arising from a "high-resolution," "high acquisition time," and/or "high radiation dose" imaging round).

Thus, the machine-learning computational model of the parameter prediction logic 1004 may predict "high-resolution" information about the area of the specimen based on a "low-resolution" imaging round. When the machine-learning computational model is accurate, a user may be able to readily assess the parameters of different areas of the specimen, and can evaluate which areas to investigate further (e.g., by one or more additional imaging rounds with different properties) without incurring the additional acquisition time and/or radiation damage associated with a second, "high-resolution" imaging round for areas that are not of further interest. This may dramatically increase the throughput of CPM imaging, which is commonly bottlenecked by the need for users of conventional CPM systems to perform high-resolution imaging of all areas in order to make even an initial assessment of which areas of a specimen are promising for further study. Further, even "expert" CPM users are not able to make accurate assessments, from a "low-resolution" imaging round, of which areas of the specimen are promising candidates for further investigation; conventional "rules of thumb" or "intuitive" guesses by a user, or even conventional analytical approaches (such as those discussed herein with reference to "bootstrapping" a machine-learning computational model), are typically incorrect, and thus reduce throughput.

In some embodiments, the machine-learning computational model of the parameter prediction logic 1004 may be a multi-layer neural network model. For example, the machine-learning computational model included in the parameter prediction logic 1004 may have a residual network (ResNet) architecture that includes skip connections over one or more of the neural network layers. The training data (e.g., input images and parameter values) may be normalized in any suitable manner (e.g., using histogram equalization and mapping parameters to an interval, such as [0,1]). Other machine-learning computational models, such as other neural network models (e.g., dense convolutional neural network models or other deep convolutional neural network models, etc.).

In some embodiments, the parameter prediction logic 1004 may be configured to initially generate the machine-learning computational model by populating some or all of the parameters of the machine-learning computational model (e.g., the weights associated with a neural network model) with initial values. In some embodiments, some or all of the initial values may be randomly generated, while in some embodiments, some or all of the initial values may be adopted from another machine-learning computational model. For example, a first machine-learning computational model may have been previously trained to generate predicted values of parameters for specimens including a first type of element-of-interest; if the user then wishes to investigate specimens including a second, different type of element-of-interest, some or all of the parameters of a second machine-learning computational model (to generate predicted values of parameters for specimens including the second type of element-of-interest) may be identical to the parameters of the first machine-learning computational model. The second machine-learning computational model may be further trained on specimens including the second type of element-of-interest, and thus the parameters of the second machine-learning computational model may not remain the same as those of the first machine-learning computational model after such training. In some embodiments, the choice of a first machine-learning computational model on which to "base" a second machine-learning computational model may be performed by a user (e.g., who may select a stored first machine-learning computational model to use as a starting point for a second machine-learning computational model via the graphical user interface (GUI) 3000 of FIG. 7, discussed below) or may be performed automatically by the parameter prediction logic 1004 (e.g., based on a similarity between the first type of element-of-interest and the second type of element-of-interest. For example, when the first type of element-of-interest is a first protein, and the second type of element-of-interest is a second, different protein, the parameter prediction logic 1004 may use a lookup table or database query to determine a similarity of protein sequences of the first and second proteins, and may use the resulting similarity to initialize a second machine-learning computational model for the second protein (e.g., by "copying" the first machine-learning computational model to act as the initial second machine-learning computational model when the similarity exceeds a threshold, or by "using" a number of the weights of the first machine-learning computational model when populating the weights of the initial second machine-learning computational model that is proportional to the similarity between the first and second proteins). In other embodiments, a similarity between the first type of element-of-interest and the second type of element-of-interest may be a similarity of shapes between the elements-of-interest (e.g., using a machine-learning computational model trained on spherical elements-of-interest as the starting point for a new machine-learning computational model to be applied to ellipsoidal elements-of-interest, or using a machine-learning computational model trained on a type of particles on a hexagonal grid as the starting point for a new machine-learning computational model to be applied to the same type of particles on a standard, non-hexagonal grid).

In some embodiments, the parameter prediction logic 1004 may deploy a machine-learning computational model only after adequate training of the machine-learning computational model (e.g., using training data including multiple first data sets and second data sets for different areas of a specimen). Before the machine-learning computational model has been trained (e.g., before adequate training data has been generated), the parameter prediction logic 1004 may use an image processing computational model, different from the machine-learning computational model, to generate predicted values of a set of parameters of an area of the specimen. Examples of such image processing computational models may include a linear regression, a histogram binarization, or any other suitable computational model. The predicted values generated by such image processing computational models may be less accurate than the predicted values generated by the trained machine-learning computational model, but the use of such image processing computational models may aid the user during the initial "bootstrap" period during which training data is being generated.

The area selection logic 1006 may determine whether a second imaging round of an area of the specimen is to be performed by a CPM based on the predicted values of the set of parameters of the area (generated by the machine-learning computational model of the parameter prediction logic 1004). If the area selection logic 1006 determines that a second imaging round of an area of the specimen is not to be performed, a second imaging round may not be performed (and thus a second data set, including measured values of the set of parameters, may not be generated for the area). The area selection logic 1006 may apply any one or more criteria to the predicted values. For example, in some embodiments, the area selection logic 1006 may determine that a second imaging round of an area of a specimen is to be performed when one or more of the predicted values of the parameters satisfied threshold criteria for those parameters. For example, in an embodiment in which the machine-learning computational model of the parameter prediction logic 1004 outputs a predicted value of the ice thickness in an area, the area selection logic 1006 may select the area for a second imaging round when the predicted value of the ice thickness is between a lower threshold and an upper threshold (whose values, for example, may be set by a user). In addition to or instead of threshold criteria, the area selection logic 1006 may determine that second imaging rounds of areas of the specimen are to be performed for all of the areas of the specimen who have one or more predicted parameter values in a "best" percentage of all predicted parameter values (indicating, e.g., that these areas are likely to have good data quality), and that second imaging rounds of areas of the specimen are not to be performed for the remaining areas (indicating, e.g., that these areas are likely to have poor data quality). For example, in an embodiment in which the machine-learning computational model of the parameter prediction logic 1004 outputs a predicted value of a data quality indicator, the area selection logic 1006 may determine that second imaging rounds are to be performed on all areas whose predicted data quality indicators are in the top 20%. This particular numerical value is simply an example, and any suitable similar criteria may be used.

In some embodiments, the criteria applied by the area selection logic 1006 to the predicted values generated by the machine-learning computational model may include probabilistic criteria. For example, for a particular area of the specimen, the area selection logic 1006 may select the area for a second round of imaging with some given probability. That probability may be independent of the predicted values of the set of parameters of the area, or may be weighted so as to increase as the predicted values of the set of parameters get "better," and/or may be weighted so as to increase as the predicted values of the set of parameters get "worse" (e.g., to generate data that can be used to retrain the machine-learning computational model as discussed below with reference to the training logic 1010). Any suitable probabilistic selection criteria may also be implemented by the area selection logic 1006.

The user interface logic 1008 may provide information to a user and receive inputs from a user (e.g., via a GUI like the GUI 3000 discussed below with reference to FIG. 7). In some embodiments, the user interface logic 1008 may cause the display, on a display device (e.g., any of the display device as discussed herein), of a graphical representation of at least some of the first data set associated with an area of the specimen. For example, FIGS. 3A and 3B are graphical representations 160 and 170, respectively, that may be provided to a user, via a display device (and a GUI, such as the GUI 3000 discussed below with reference to FIG. 7), as part of the area selection techniques disclosed herein, in accordance with various embodiments. The graphical representation 160 may include at least some of the first data set associated with one or more areas of the specimen. For example, the graphical representation 160 of FIG. 3A depicts a patch 102 of a cryo-EM sample (e.g., the cryo-EM sample 100 of FIG. 2) having multiple holes 104 therein. Individual ones of the holes 104 may correspond to different individual areas that may be analyzed in accordance with the area selection techniques disclosed herein, and the graphical representation 160 of FIG. 3A illustrates an embodiment in which the first "low-resolution" data set of the holes 104 of the specimen are acquired by capturing a "low-resolution" image of the entire patch 102; the portion of the image of the entire patch 102 corresponding to a particular hole 104 may serve as the first data set associated with the hole 104.

In some embodiments, the user interface logic 1008 may cause the display, on a display device (e.g., any of the display device as discussed herein), of a graphical representation of at least some of the predicted values (generated by the parameter prediction logic 1004) of the set of parameters associated with an area of the specimen. For example, the graphical representation 170 of FIG. 3B may include the graphical representation 160 of FIG. 3A (e.g., a "raw" image) with a left dot and a right dot superimposed on each of the holes 104. The shading (or color, or other property) of the left dot may indicate a predicted value of a parameter associated with the corresponding hole 104 (e.g., an ice thickness) (e.g., with darker dots indicating thicker ice, and vice versa). This particular example is simply illustrative, and the predicted value of a parameter associated with an area of a specimen may be indicated in any suitable manner. The user interface logic 1008 may cause display of the predicted values of the parameters concurrently with the display of the first data set (e.g., as depicted in the graphical representation 170 of FIG. 3B), or may cause display of the predicted values of the parameters without the concurrent display of the first data set.

In some embodiments, the user interface logic 1008 may cause the display, on a display device (e.g., any of the display device as discussed herein), of a graphical representation of at least some of the measured values (generated by the imaging logic 1002) of the set of parameters associated with an area of the specimen. For example, in the graphical representation 170 of FIG. 3B, the shading (or color, or other property) of the right dot may indicate a measured value of a parameter associated with the corresponding hole 104 (e.g., an ice thickness) (e.g., with darker dots indicating thicker ice, and vice versa). This particular example is simply illustrative, and the measured value of a parameter associated with an area of a specimen may be indicated in any suitable manner. Further, although the graphical representation 170 of FIG. 3B indicates both a predicted value (left dot) and a measured value (right dot) for each hole 104 (indicating that each hole 104 was imaged in a first imaging round and a second imaging round), this is simply illustrative, and in some embodiments, fewer than all of the areas imaged in a first imaging round will be imaged in a second imaging round. The user interface logic 1008 may cause display of the measured values of the parameters concurrently with the display of the first data set (e.g., as depicted in the graphical representation 170 of FIG. 3B), or may cause display of the measured values of the parameters without the concurrent display of the first data set. In some embodiments, only predicted values (e.g., the left dots) of one or more of the parameters associated with an area of a specimen will be displayed by the user interface logic 1008; in other embodiments, only measured values (e.g., the right dots) of one or more of the parameters associated with an area of a specimen will be displayed by the user interface logic 1008, or both the predicted values (e.g., the left dots) and the measured values (e.g., the right dots) of one or more of the parameters associated with an area of a specimen may be concurrently displayed.

In some embodiments, the user interface logic 1008 may cause the display of one or more performance metrics of the machine-learning computational model. For example, the graphical representation 170 of FIG. 3B communicates a performance metric of the machine-learning computational model by depicting the left dots and right dots side-by-side; if the predicted values (generated by the machine-learning computational model) are the same as or close to the measured values, the left dot and the right dot associated with a particular area (e.g., a hole 104) will have the same or similar shading. If the predicted values and the measured values are very different, the left dot and the right dot associated with a particular area (e.g., a hole 104) will have different shading, visually indicating the discrepancy. Any other suitable way of displaying a performance metric of the machine-learning computational model may be used. For example, the user interface logic 1008 may display a plot of error over time, showing how the error of the machine-learning computational model (e.g., generated by the training logic 1010 during validation of the machine-learning computational model) has changed as rounds of additional training have been performed.

The training logic 1010 may be configured to train the machine-learning computational model of the parameter prediction logic 1004 on a set of training data, and to retrain the machine-learning computational model as additional training data is received. As known in the art, the training data may include sets of input-output pairs (e.g., pairs of input "low resolution" first images of an area of a specimen and corresponding measured values of parameters of the area of the specimen), and the training logic 1010 may use this training data to train the machine-learning computational model (e.g., by adjusting weights and other parameters of the machine-learning computational model) in accordance with any suitable technique (e.g., a gradient descent algorithm). In some embodiments, the training logic 1010 may reserve a portion of the available training data for use as validation data, as known in the art.

The training logic 1010 may retrain the machine-learning computational model of the parameter prediction logic 1004 once a retraining condition has been met. For example, in some embodiments, the training logic 1010 may retrain the machine-learning computational model of the parameter prediction logic 1004 upon accumulation of a threshold number of "new" training data sets (e.g., 20 training data sets). In some embodiments, the training logic 1010 may retrain the machine-learning computational model with whatever retraining data sets are available upon receipt of a retraining command from a user (e.g., via a GUI like the GUI 3000 of FIG. 7). In some embodiments, the training logic 1010 may retrain the machine-learning computational model when one or more performance metrics of the machine-learning computational model (e.g., an error on one or more validation data sets) meet one or more retraining criteria (e.g., the error increases a threshold amount from a previous training round). In some embodiments, the retraining condition may include any one or more of these conditions.

FIG. 4 is a flow diagram of a method 2000 of area selection in charged particle microscope imaging, in accordance with various embodiments. Although the operations of the method 2000 may be illustrated with reference to particular embodiments disclosed herein (e.g., the CPM support modules 1000 discussed herein with reference to FIG. 1, the GUI 3000 discussed herein with reference to FIG. 7, the computing devices 4000 discussed herein with reference to FIG. 8, and/or the CPM support system 5000 discussed herein with reference to FIG. 9), the method 2000 may be used in any suitable setting to perform any suitable support operations. Operations are illustrated once each and in a particular order in FIG. 4, but the operations may be reordered and/or repeated as desired and appropriate (e.g., different operations performed may be performed in parallel, as suitable).

At 2002, a first data set associated with an area of a specimen may be generated by processing data from a first imaging round of the area by a CPM. For example, the imaging logic 1002 of a CPM support module 1000 may perform the operations of 2002 in accordance with any of the embodiments disclosed herein.

At 2004, the first data set associated with the area may be provided to a machine-learning computational model to generate predicted values of a set of parameters of the area. For example, the parameter prediction logic 1004 of a CPM support module 1000 may perform the operations of 2004 in accordance with any of the embodiments disclosed herein.

At 2006, it may be determined whether a second imaging round of the area is to be performed by the charged particle microscope based on the predicted values of the set of parameters of the area. For example, the area selection logic 1006 of a CMP support module 1000 may perform the operations of 2006 in accordance with any of the embodiments disclosed herein.

At 2008, in response to a determination that a second imaging round of the area is to be performed, a second data set associated with the area may be generated by processing data from a second imaging round of the area by the charged particle microscope, wherein the second data set includes measured values of the set of parameters of the area. For example, the imaging logic 1002 of a CPM support module 1000 may perform the operations of 2008 in accordance with any of the embodiments disclosed herein.

At 2010, the display, on a display device, of an indication of a difference between the predicted values of the set of parameters of the area and the measured values of the set of parameters of the area may be caused. For example, the user interface logic 1008 may perform the operations of 2010 in accordance with any of the embodiments disclosed herein.

At 2012, the machine-learning computational model may be retrained using the first data set and the second data set. For example, the training logic 1010 may perform the operations of 2012 in accordance with any of the embodiments disclosed herein.

Figure 5:
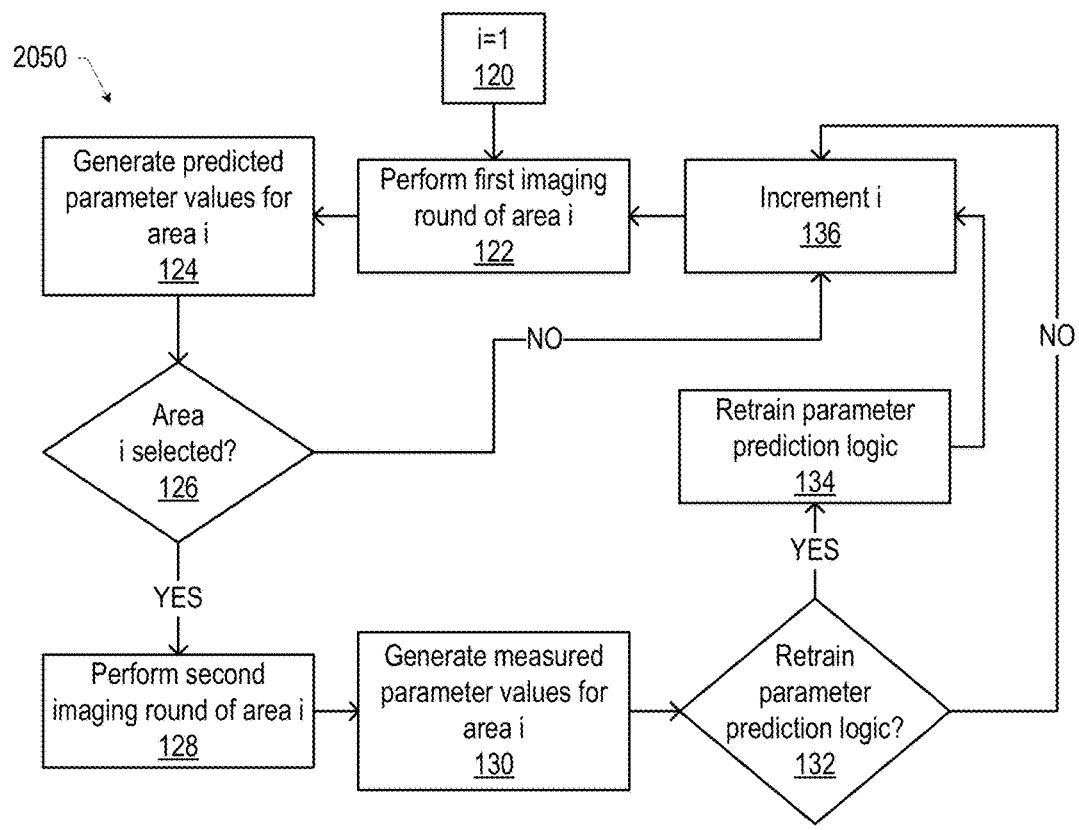

FIG. 5 is a flow diagram of a method 2050 of area selection in charged particle microscope imaging, in accordance with various embodiments. The operations of the method 2050 of FIG. 5 may be part of the method 2000 of FIG. 4, as discussed further below. Although the operations of the method 2050 may be illustrated with reference to particular embodiments disclosed herein (e.g., the CPM support modules 1000 discussed herein with reference to FIG. 1, the GUI 3000 discussed herein with reference to FIG. 7, the computing devices 4000 discussed herein with reference to FIG. 8, and/or the CPM support system 5000 discussed herein with reference to FIG. 9), the method 2050 may be used in any suitable setting to perform any suitable support operations. Operations are illustrated once each and in a particular order in FIG. 5, but the operations may be reordered and/or repeated as desired and appropriate (e.g., different operations performed may be performed in parallel, as suitable).

At 120, an area counter variable i may be initialized to an initial value. For example, the imaging logic 1002 of a CPM support module 1000 may perform the operations of 120. Although FIG. 5 indicates this initial value is "1," any suitable area counter variable may be used and initialized appropriately.

At 122, a first imaging round of area i may be performed. For example, the imaging logic 1002 of a CPM support module 1000 may cause a CPM to perform a first "low-resolution" imaging round of the area i, and the imaging logic 1002 may generate a first data set for the area i based on this first imaging round (e.g., in accordance with any of the embodiments disclosed herein).

At 124, predicted parameter values for the area i may be generated. For example, the parameter prediction logic 1004 of a CPM support module 1000 may generate the predicted values of a set of parameters of the area i based on the first imaging round of the area i (performed at 122) (e.g., based on the first data set for the area i generated by the imaging logic 1002, in accordance with any of the embodiments disclosed herein).

At 126, it may be determined whether the area i is selected for a second imaging round. For example, the area selection logic 1006 of a CPM support module 1000 may determine whether the area i is to be selected for a second imaging round in accordance with any of the embodiments disclosed herein.

When it is determined at 126 that the area i is selected for a second imaging round, the method 2050 may proceed to 128, at which a second imaging round of area i may be performed. For example, the imaging logic 1002 of a CPM support module 1000 may cause a CPM to perform a second "high-resolution" imaging round of the area i, and the imaging logic 1002 may generate a second data set for the area i based on the second imaging round (e.g., in accordance with any of the embodiments disclosed herein).

At 130, measured parameter values for the area i may be generated. For example, the imaging logic 1002 of a CPM support module 1000 may generate the measured values of the set of parameters of the area i based on the second imaging round of the area i (performed at 128) (e.g., included in the second data set for the area i generated by the imaging logic 1002, in accordance with any of the embodiments disclosed herein).

At 132, it may be determined whether to retrain the parameter prediction logic. For example, the training logic 1010 may determine whether a retraining condition for the machine-learning computational model of the parameter prediction logic 1004 has been met in accordance with any of the embodiments disclosed herein.

When it is determined at 132 that the parameter prediction logic is to be retrained, the method 2050 may proceed to 134 at which the parameter prediction logic may be retrained. Data generated in the first imaging round and the second imaging round of area i may be used in the retraining. For example, the training logic 1010 may retrain the machine-learning computational model of the parameter prediction logic in accordance with any of the embodiments disclosed herein.

When it is determined at 126 that the area i is not selected for a second imaging round, when it is determined at 132 not to retrain the parameter prediction logic, or subsequent to 134, the method 2050 may proceed to 136 at which the area counter variable i is incremented. For example, the imaging logic 1002 may increment the area counter variable i. The method 2050 may then return to 122 for a different area i, and the operations of 122-136 may be repeated until all areas have been imaged.

Figure 6:
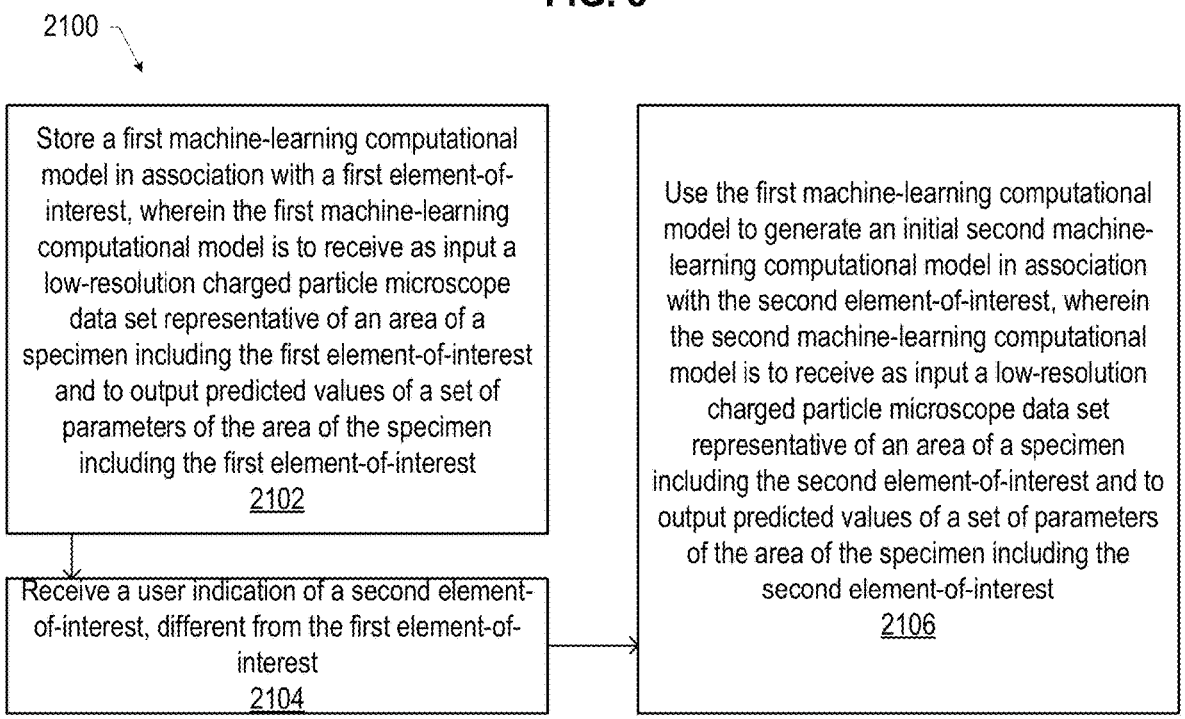
FIG. 6 is a flow diagram of an example method of generating machine-learning computational models for area selection in CPM imaging, in accordance with various embodiments.

FIG. 6 is a flow diagram of a method 2100 of generating machine-learning computational models (e.g., for use by the parameter prediction logic 1004) for area selection in CPM imaging, in accordance with various embodiments. The operations of the method 2100 of FIG. 6 may be used to generate an initial machine-learning computational model for any suitable ones of the other methods disclosed herein, for example. Although the operations of the method 2100 may be illustrated with reference to particular embodiments disclosed herein (e.g., the CPM support modules 1000 discussed herein with reference to FIG. 1, the GUI 3000 discussed herein with reference to FIG. 7, the computing devices 4000 discussed herein with reference to FIG. 8, and/or the CPM support system 5000 discussed herein with reference to FIG. 9), the method 2100 may be used in any suitable setting to perform any suitable support operations. Operations are illustrated once each and in a particular order in FIG. 6, but the operations may be reordered and/or repeated as desired and appropriate (e.g., different operations performed may be performed in parallel, as suitable).

At 2102, a first machine-learning computational model may be stored in association with a first element-of-interest. The first machine-learning computational model may be to receive as input a low-resolution charged particle microscope data set representative of an area of a specimen including the first element-of-interest and to output predicted values of a set of parameters of the area of the specimen including the first element-of-interest. For example, the parameter prediction logic 1004 may perform the operations of 2102 (e.g., in accordance with any of the embodiments disclosed herein).

At 2104, a user indication may be received of a second element-of-interest, different from the first element-of-interest. For example, the user interface logic 1008 may perform the operations of 2104 (e.g., in accordance with the GUI 3000 of FIG. 7 or any other embodiments disclosed herein).

At 2106, the first machine-learning computational model may be used to generate an initial second machine-learning computational model in association with the second element-of-interest. The second machine-learning computational model may be to receive as input a low-resolution charged particle microscope data set representative of an area of a specimen including the second element-of-interest and to output predicted values of the set of parameters of the area of the specimen including the second element-of-interest. For example, the parameter prediction logic 1004 may perform the operations of 2106 (e.g., in accordance with any of the embodiments disclosed herein).

Figure 8:
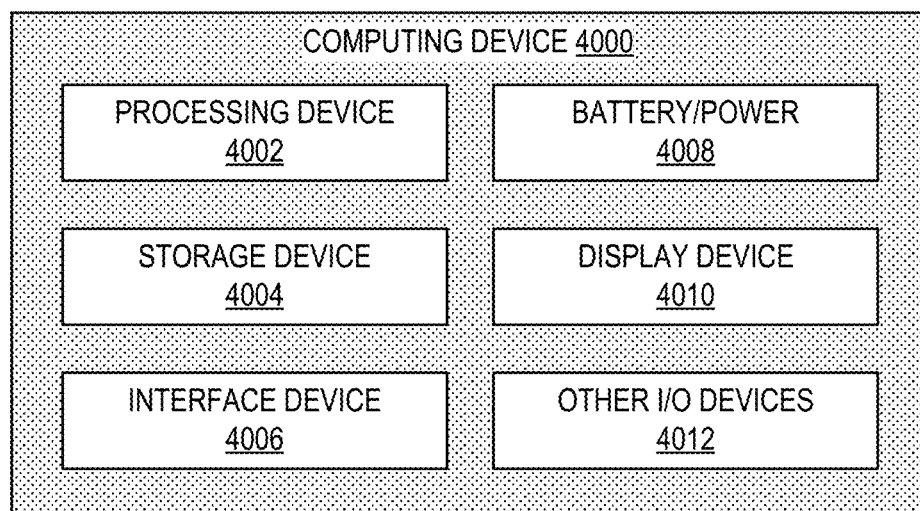
FIG. 8 is a block diagram of an example computing device that may perform some or all of the support methods disclosed herein, in accordance with various embodiments.
Figure 9:
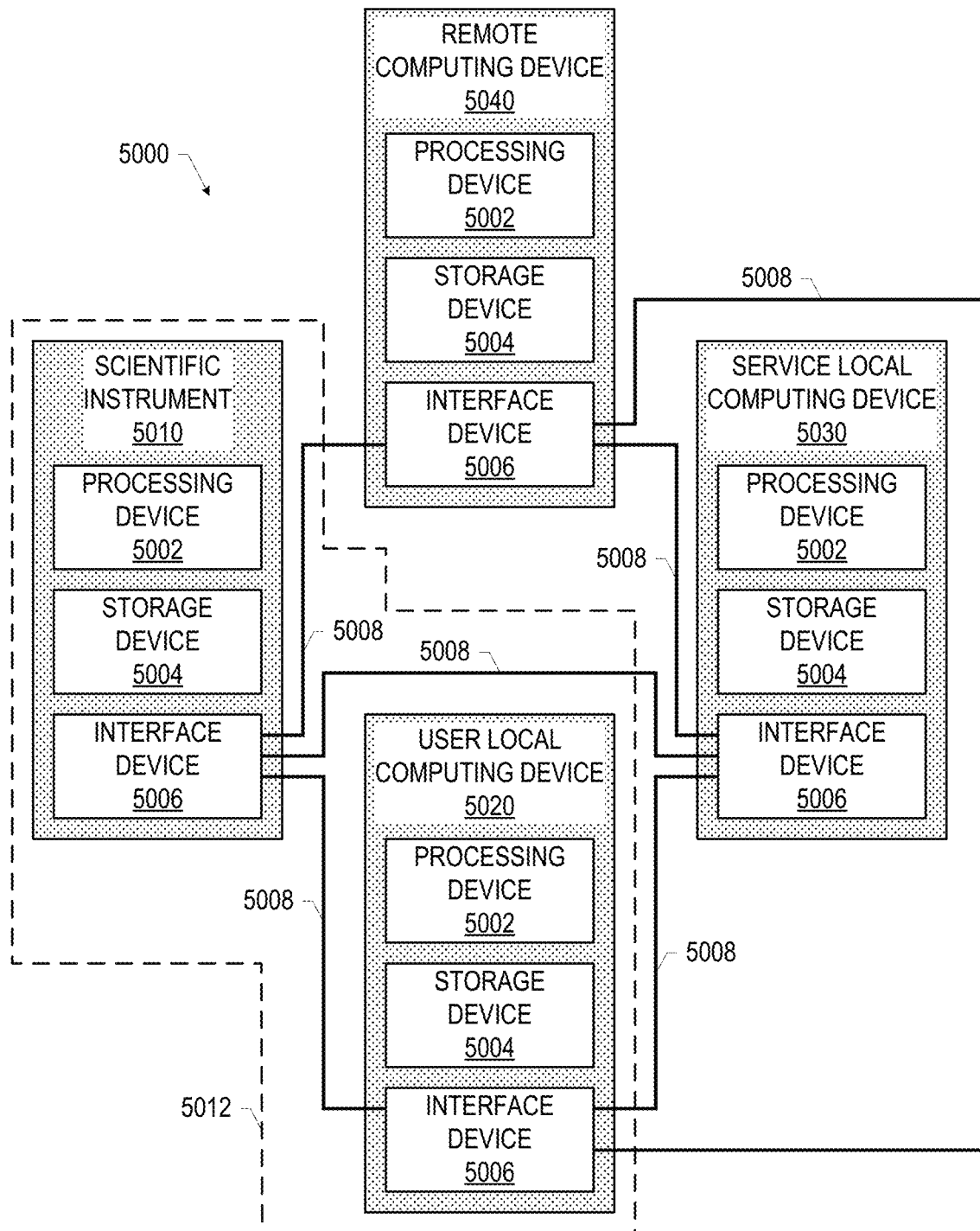
FIG. 9 is a block diagram of an example CPM support system in which some or all of the support methods disclosed herein may be performed, in accordance with various embodiments.

The CPM support methods disclosed herein may include interactions with a human user (e.g., via the user local computing device 5020 discussed herein with reference to FIG. 9). These interactions may include providing information to the user (e.g., information regarding the operation of a CPM such as the CPM 5010 of FIG. 9, information regarding a sample being analyzed or other test or measurement performed by a CPM, information retrieved from a local or remote database, or other information) or providing an option for a user to input commands (e.g., to control the operation of a CPM such as the CPM 5010 of FIG. 9, or to control the analysis of data generated by a CPM), queries (e.g., to a local or remote database), or other information. In some embodiments, these interactions may be performed through a graphical user interface (GUI) that includes a visual display on a display device (e.g., the display device 4010 discussed herein with reference to FIG. 8) that provides outputs to the user and/or prompts the user to provide inputs (e.g., via one or more input devices, such as a keyboard, mouse, trackpad, or touchscreen, included in the other I/O devices 4012 discussed herein with reference to FIG. 8). The CPM support systems disclosed herein may include any suitable GUIs for interaction with a user.

Figure 7:
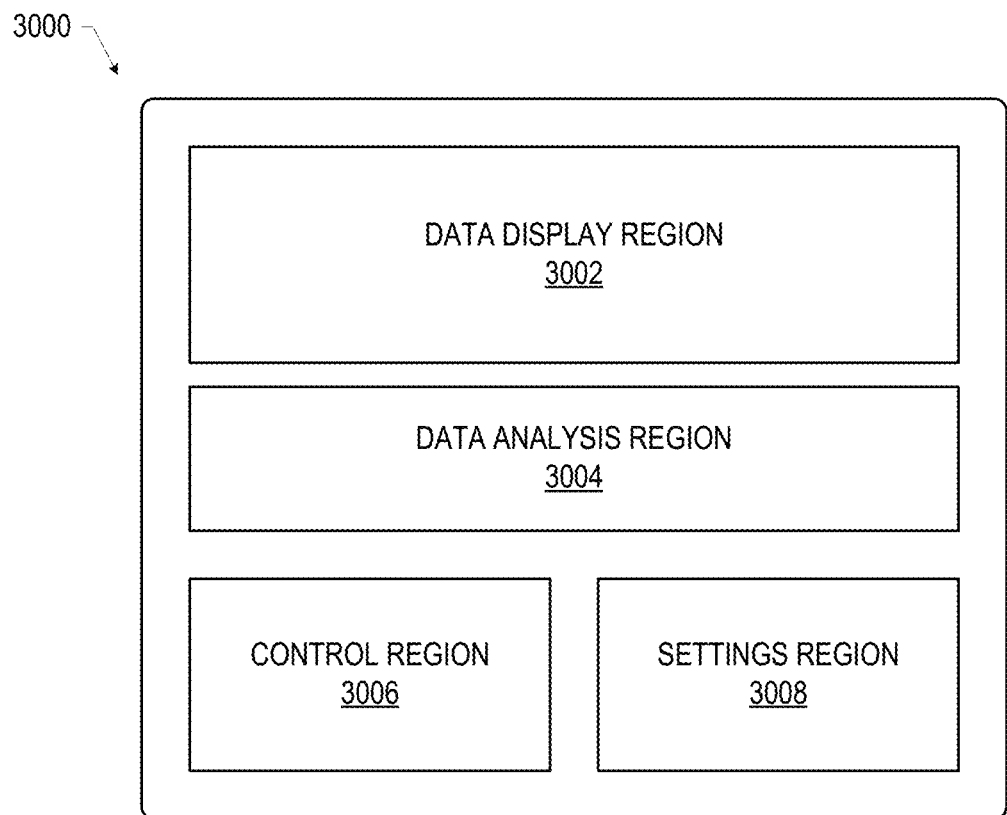
FIG. 7 is an example of a graphical user interface that may be used in the performance of some or all of the support methods disclosed herein, in accordance with various embodiments.

FIG. 7 depicts an example GUI 3000 that may be used in the performance of some or all of the support methods disclosed herein, in accordance with various embodiments. As noted above, the GUI 3000 may be provided on a display device (e.g., the display device 4010 discussed herein with reference to FIG. 8) of a computing device (e.g., the computing device 4000 discussed herein with reference to FIG. 8) of a CPM support system (e.g., the CPM support system 5000 discussed herein with reference to FIG. 9), and a user may interact with the GUI 3000 using any suitable input device (e.g., any of the input devices included in the other I/O devices 4012 discussed herein with reference to FIG. 8) and input technique (e.g., movement of a cursor, motion capture, facial recognition, gesture detection, voice recognition, actuation of buttons, etc.).

The GUI 3000 may include a data display region 3002, a data analysis region 3004, a CPM control region 3006, and a settings region 3008. The particular number and arrangement of regions depicted in FIG. 7 is simply illustrative, and any number and arrangement of regions, including any desired features, may be included in a GUI 3000.

The data display region 3002 may display data generated by a CPM (e.g., the CPM 5010 discussed herein with reference to FIG. 9). For example, the data display region 3002 may display the first data set and/or the second data set generated by the imaging logic 1002 for different areas of a specimen (e.g., the graphical representation 160 of FIG. 3A).

The data analysis region 3004 may display the results of data analysis (e.g., the results of analyzing the data illustrated in the data display region 3002 and/or other data). For example, the data analysis region 3004 may display the predicted values of a set of parameters associated with an area of a specimen (e.g., as generated by the parameter prediction logic 1004) and/or the measured values of a set of parameters associated with an area of a specimen (e.g., as generated by the imaging logic 1002). For example, the data analysis region 3004 may display a graphical representation like the graphical representation 170 of FIG. 3B (e.g., including the first data set associated with an area, the predicted values of a set of parameters associated with the area, and/or the measured values of a set of parameters associated with the area, as discussed above). In some embodiments, the data display region 3002 and the data analysis region 3004 may be combined in the GUI 3000 (e.g., to include data output from a CPM, and some analysis of the data, in a common graph or region).

The CPM control region 3006 may include options that allow the user to control a CPM (e.g., the CPM 5010 discussed herein with reference to FIG. 9) or analysis or processing of data generated by the CPM. For example, the CPM control region 3006 may include user-selectable options to retrain a machine-learning computational model, generate a new machine-learning computational model from a previous machine-learning computational model (e.g., as discussed above with reference to the method 2100 of FIG. 6), or perform other control functions (e.g., confirming or updating the output of the area selection logic 1006 to control the areas to be imaged with a second imaging round).

The settings region 3008 may include options that allow the user to control the features and functions of the GUI 3000 (and/or other GUIs) and/or perform common computing operations with respect to the data display region 3002 and data analysis region 3004 (e.g., saving data on a storage device, such as the storage device 4004 discussed herein with reference to FIG. 8, sending data to another user, labeling data, etc.).

As noted above, the CPM support module 1000 may be implemented by one or more computing devices. FIG. 8 is a block diagram of a computing device 4000 that may perform some or all of the CPM support methods disclosed herein, in accordance with various embodiments. In some embodiments, the CPM support module 1000 may be implemented by a single computing device 4000 or by multiple computing devices 4000. Further, as discussed below, a computing device 4000 (or multiple computing devices 4000) that implements the CPM support module 1000 may be part of one or more of the CPM 5010, the user local computing device 5020, the service local computing device 5030, or the remote computing device 5040 of FIG. 9.

The computing device 4000 of FIG. 8 is illustrated as having a number of components, but any one or more of these components may be omitted or duplicated, as suitable for the application and setting. In some embodiments, some or all of the components included in the computing device 4000 may be attached to one or more motherboards and enclosed in a housing (e.g., including plastic, metal, and/or other materials). In some embodiments, some these components may be fabricated onto a single system-on-a-chip (SoC) (e.g., an SoC may include one or more processing devices 4002 and one or more storage devices 4004). Additionally, in various embodiments, the computing device 4000 may not include one or more of the components illustrated in FIG. 8, but may include interface circuitry (not shown) for coupling to the one or more components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 4000 may not include a display device 4010, but may include display device interface circuitry (e.g., a connector and driver circuitry) to which a display device 4010 may be coupled.

The computing device 4000 may include a processing device 4002 (e.g., one or more processing devices). As used herein, the term "processing device" may refer to any device or portion of a device that processes electronic data from registers and/or memory to transform that electronic data into other electronic data that may be stored in registers and/or memory. The processing device 4002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 4000 may include a storage device 4004 (e.g., one or more storage devices). The storage device 4004 may include one or more memory devices such as random access memory (RAM) (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some embodiments, the storage device 4004 may include memory that shares a die with a processing device 4002. In such an embodiment, the memory may be used as cache memory and may include embedded dynamic random-access memory (eDRAM) or spin transfer torque magnetic random-access memory (STT-MRAM), for example. In some embodiments, the storage device 4004 may include non-transitory computer readable media having instructions thereon that, when executed by one or more processing devices (e.g., the processing device 4002), cause the computing device 4000 to perform any appropriate ones of or portions of the methods disclosed herein.

The computing device 4000 may include an interface device 4006 (e.g., one or more interface devices 4006). The interface device 4006 may include one or more communication chips, connectors, and/or other hardware and software to govern communications between the computing device 4000 and other computing devices. For example, the interface device 4006 may include circuitry for managing wireless communications for the transfer of data to and from the computing device 4000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. Circuitry included in the interface device 4006 for managing wireless communications may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). In some embodiments, circuitry included in the interface device 4006 for managing wireless communications may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In some embodiments, circuitry included in the interface device 4006 for managing wireless communications may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In some embodiments, circuitry included in the interface device 4006 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some embodiments, the interface device 4006 may include one or more antennas (e.g., one or more antenna arrays) to receipt and/or transmission of wireless communications.

In some embodiments, the interface device 4006 may include circuitry for managing wired communications, such as electrical, optical, or any other suitable communication protocols. For example, the interface device 4006 may include circuitry to support communications in accordance with Ethernet technologies. In some embodiments, the interface device 4006 may support both wireless and wired communication, and/or may support multiple wired communication protocols and/or multiple wireless communication protocols. For example, a first set of circuitry of the interface device 4006 may be dedicated to shorter-range wireless communications such as Wi-Fi or Bluetooth, and a second set of circuitry of the interface device 4006 may be dedicated to longer-range wireless communications such as global positioning system (GPS), EDGE, GPRS, CDMA, WiMAX, LTE, EV-DO, or others. In some embodiments, a first set of circuitry of the interface device 4006 may be dedicated to wireless communications, and a second set of circuitry of the interface device 4006 may be dedicated to wired communications.

The computing device 4000 may include battery/power circuitry 4008. The battery/power circuitry 4008 may include one or more energy storage devices (e.g., batteries or capacitors) and/or circuitry for coupling components of the computing device 4000 to an energy source separate from the computing device 4000 (e.g., AC line power).

The computing device 4000 may include a display device 4010 (e.g., multiple display devices). The display device 4010 may include any visual indicators, such as a heads-up display, a computer monitor, a projector, a touchscreen display, a liquid crystal display (LCD), a light-emitting diode display, or a flat panel display.

The computing device 4000 may include other input/output (I/O) devices 4012. The other I/O devices 4012 may include one or more audio output devices (e.g., speakers, headsets, earbuds, alarms, etc.), one or more audio input devices (e.g., microphones or microphone arrays), location devices (e.g., GPS devices in communication with a satellite-based system to receive a location of the computing device 4000, as known in the art), audio codecs, video codecs, printers, sensors (e.g., thermocouples or other temperature sensors, humidity sensors, pressure sensors, vibration sensors, accelerometers, gyroscopes, etc.), image capture devices such as cameras, keyboards, cursor control devices such as a mouse, a stylus, a trackball, or a touchpad, bar code readers, Quick Response (QR) code readers, or radio frequency identification (RFID) readers, for example.

The computing device 4000 may have any suitable form factor for its application and setting, such as a handheld or mobile computing device (e.g., a cell phone, a smart phone, a mobile internet device, a tablet computer, a laptop computer, a netbook computer, an ultrabook computer, a personal digital assistant (PDA), an ultra-mobile personal computer, etc.), a desktop computing device, or a server computing device or other networked computing component.

One or more computing devices implementing any of the CPM support modules or methods disclosed herein may be part of a CPM support system. FIG. 9 is a block diagram of an example CPM support system 5000 in which some or all of the CPM support methods disclosed herein may be performed, in accordance with various embodiments. The CPM support modules and methods disclosed herein (e.g., the CPM support module 1000 of FIG. 1 and the method 2000 of FIG. 2) may be implemented by one or more of the CPM 5010, the user local computing device 5020, the service local computing device 5030, or the remote computing device 5040 of the CPM support system 5000.

Any of the CPM 5010, the user local computing device 5020, the service local computing device 5030, or the remote computing device 5040 may include any of the embodiments of the computing device 4000 discussed herein with reference to FIG. 8, and any of the CPM 5010, the user local computing device 5020, the service local computing device 5030, or the remote computing device 5040 may take the form of any appropriate ones of the embodiments of the computing device 4000 discussed herein with reference to FIG. 8.

The CPM 5010, the user local computing device 5020, the service local computing device 5030, or the remote computing device 5040 may each include a processing device 5002, a storage device 5004, and an interface device 5006. The processing device 5002 may take any suitable form, including the form of any of the processing devices 4002 discussed herein with reference to FIG. 4, and the processing devices 5002 included in different ones of the CPM 5010, the user local computing device 5020, the service local computing device 5030, or the remote computing device 5040 may take the same form or different forms. The storage device 5004 may take any suitable form, including the form of any of the storage devices 5004 discussed herein with reference to FIG. 4, and the storage devices 5004 included in different ones of the CPM 5010, the user local computing device 5020, the service local computing device 5030, or the remote computing device 5040 may take the same form or different forms. The interface device 5006 may take any suitable form, including the form of any of the interface devices 4006 discussed herein with reference to FIG. 4, and the interface devices 5006 included in different ones of the CPM 5010, the user local computing device 5020, the service local computing device 5030, or the remote computing device 5040 may take the same form or different forms.

The CPM 5010, the user local computing device 5020, the service local computing device 5030, and the remote computing device 5040 may be in communication with other elements of the CPM support system 5000 via communication pathways 5008. The communication pathways 5008 may communicatively couple the interface devices 5006 of different ones of the elements of the CPM support system 5000, as shown, and may be wired or wireless communication pathways (e.g., in accordance with any of the communication techniques discussed herein with reference to the interface devices 4006 of the computing device 4000 of FIG. 8). The particular CPM support system 5000 depicted in FIG. 9 includes communication pathways between each pair of the CPM 5010, the user local computing device 5020, the service local computing device 5030, and the remote computing device 5040, but this "fully connected" implementation is simply illustrative, and in various embodiments, various ones of the communication pathways 5008 may be absent. For example, in some embodiments, a service local computing device 5030 may not have a direct communication pathway 5008 between its interface device 5006 and the interface device 5006 of the CPM 5010, but may instead communicate with the CPM 5010 via the communication pathway 5008 between the service local computing device 5030 and the user local computing device 5020 and the communication pathway 5008 between the user local computing device 5020 and the CPM 5010. The CPM 5010 may include any appropriate CPM, such as a SEM, a TEM, a STEM, or an ion beam microscope.

The user local computing device 5020 may be a computing device (e.g., in accordance with any of the embodiments of the computing device 4000 discussed herein) that is local to a user of the CPM 5010. In some embodiments, the user local computing device 5020 may also be local to the CPM 5010, but this need not be the case; for example, a user local computing device 5020 that is in a user's home or office may be remote from, but in communication with, the CPM 5010 so that the user may use the user local computing device 5020 to control and/or access data from the CPM 5010. In some embodiments, the user local computing device 5020 may be a laptop, smartphone, or tablet device. In some embodiments the user local computing device 5020 may be a portable computing device.

The service local computing device 5030 may be a computing device (e.g., in accordance with any of the embodiments of the computing device 4000 discussed herein) that is local to an entity that services the CPM 5010. For example, the service local computing device 5030 may be local to a manufacturer of the CPM 5010 or to a third-party service company. In some embodiments, the service local computing device 5030 may communicate with the CPM 5010, the user local computing device 5020, and/or the remote computing device 5040 (e.g., via a direct communication pathway 5008 or via multiple "indirect" communication pathways 5008, as discussed above) to receive data regarding the operation of the CPM 5010, the user local computing device 5020, and/or the remote computing device 5040 (e.g., the results of self-tests of the CPM 5010, calibration coefficients used by the CPM 5010, the measurements of sensors associated with the CPM 5010, etc.). In some embodiments, the service local computing device 5030 may communicate with the CPM 5010, the user local computing device 5020, and/or the remote computing device 5040 (e.g., via a direct communication pathway 5008 or via multiple "indirect" communication pathways 5008, as discussed above) to transmit data to the CPM 5010, the user local computing device 5020, and/or the remote computing device 5040 (e.g., to update programmed instructions, such as firmware, in the CPM 5010, to initiate the performance of test or calibration sequences in the CPM 5010, to update programmed instructions, such as software, in the user local computing device 5020 or the remote computing device 5040, etc.). A user of the CPM 5010 may utilize the CPM 5010 or the user local computing device 5020 to communicate with the service local computing device 5030 to report a problem with the CPM 5010 or the user local computing device 5020, to request a visit from a technician to improve the operation of the CPM 5010, to order consumables or replacement parts associated with the CPM 5010, or for other purposes.

The remote computing device 5040 may be a computing device (e.g., in accordance with any of the embodiments of the computing device 4000 discussed herein) that is remote from the CPM 5010 and/or from the user local computing device 5020. In some embodiments, the remote computing device 5040 may be included in a datacenter or other large-scale server environment. In some embodiments, the remote computing device 5040 may include network-attached storage (e.g., as part of the storage device 5004). The remote computing device 5040 may store data generated by the CPM 5010, perform analyses of the data generated by the CPM 5010 (e.g., in accordance with programmed instructions), facilitate communication between the user local computing device 5020 and the CPM 5010, and/or facilitate communication between the service local computing device 5030 and the CPM 5010.

In some embodiments, one or more of the elements of the CPM support system 5000 illustrated in FIG. 9 may not be present. Further, in some embodiments, multiple ones of various ones of the elements of the CPM support system 5000 of FIG. 9 may be present. For example, a CPM support system 5000 may include multiple user local computing devices 5020 (e.g., different user local computing devices 5020 associated with different users or in different locations). In another example, a CPM support system 5000 may include multiple CPMs 5010, all in communication with service local computing device 5030 and/or a remote computing device 5040; in such an embodiment, the service local computing device 5030 may monitor these multiple CPMs 5010, and the service local computing device 5030 may cause updates or other information may be "broadcast" to multiple CPMs 5010 at the same time. Different ones of the CPMs 5010 in a CPM support system 5000 may be located close to one another (e.g., in the same room) or farther from one another (e.g., on different floors of a building, in different buildings, in different cities, etc.). In some embodiments, a CPM 5010 may be connected to an Internet-of-Things (IoT) stack that allows for command and control of the CPM 5010 through a web-based application, a virtual or augmented reality application, a mobile application, and/or a desktop application. Any of these applications may be accessed by a user operating the user local computing device 5020 in communication with the CPM 5010 by the intervening remote computing device 5040. In some embodiments, a CPM 5010 may be sold by the manufacturer along with one or more associated user local computing devices 5020 as part of a local CPM computing unit 5012.

The following paragraphs provide various examples of the embodiments disclosed herein.

Example 1 is a charged particle microscope support apparatus, including: first logic to generate a first data set associated with an area of a specimen by processing data from a first imaging round of the area by a charged particle microscope; second logic to provide the first data set associated with the area to a machine-learning computational model to generate predicted values of a set of parameters of the area; third logic to determine whether a second imaging round of the area is to be performed by the charged particle microscope based on the predicted values of the set of parameters of the area; wherein the first logic is to, in response to a determination by the third logic that a second imaging round of the area is to be performed, generate a second data set associated with the area by processing data from a second imaging round of the area by the charged particle microscope, wherein the second data set includes measured values of the set of parameters of the area; and fourth logic to retrain the machine-learning computational model using the first data set and the second data set.

Example 2 includes the subject matter of Example 1, and further includes: the charged particle microscope.

Example 3 includes the subject matter of any of Examples 1-2, and further specifies that an acquisition time for the first imaging round is less than an acquisition time for the second imaging round.

Example 4 includes the subject matter of any of Examples 1-3, and further specifies that a radiation dose of the first imaging round is less than a radiation dose of the second imaging round.

Example 5 includes the subject matter of any of Examples 1-4, and further specifies that the machine-learning computational model includes a multi-layer neural network model.

Example 6 includes the subject matter of any of Examples 1-5, and further specifies that: the second logic is to, before providing the first data set associated with the area to the machine-learning computational model to generate the predicted values of the set of parameters of the area, generate predicted values of a set of parameters of an other area of the specimen by providing an other data set associated with the other area to an image processing computational model, different from the machine-learning computational model, to generate predicted values of the set of parameters of the other area of the specimen; and the first logic is to, before generating the first data set, generate the other data set associated with the other area of a specimen by processing data from an imaging round of the other area by the charged particle microscope.

Example 7 includes the subject matter of Example 6, and further specifies that the image processing computational model computational model includes a linear regression or a histogram binarization.

Example 8 includes the subject matter of any of Examples 1-7, and further specifies that the set of parameters includes a data quality indicator.

Example 9 includes the subject matter of any of Examples 1-8, and further specifies that the set of parameters includes ice thickness.

Example 10 includes the subject matter of any of Examples 1-9, and further specifies that the set of parameters includes a count of elements-of-interest, a level of contamination, an amount of specimen movement, an amount of specimen degradation, or an orientation distribution of elements-of-interest.

Example 11 includes the subject matter of any of Examples 1-10, and further specifies that the second logic is to, before using the machine-learning computational model, initially generate the machine-learning computational model.

Example 12 includes the subject matter of Example 11, and further specifies that the second logic is to initially generate the machine-learning computational model by selecting random values for at least some of parameters of the machine-learning computational model.

Example 13 includes the subject matter of any of Examples 11-12, and further specifies that the second logic is to initially generate the machine-learning computational model by adopting at least some parameters from another machine-learning computational model.

Example 14 includes the subject matter of Example 13, and further specifies that the specimen includes a first element-of-interest, the other machine-learning computational model is associated with a specimen that includes a second element-of-interest, and the second logic is to initially generate the machine-learning computational model, using a similarity between the first element-of-interest and the second element-of-interest, by adopting at least some parameters from the other machine-learning computational model.

Example 15 includes the subject matter of Example 14, and further specifies that the first element-of-interest is a first protein, the second element-of-interest is a second protein, and the similarity between the first protein and the second protein is a similarity of protein sequences of the first protein and the second protein.

Example 16 includes the subject matter of any of Examples 1-14, and further specifies that: the area of the specimen is a first area of the specimen; the first logic is to generate a first data set associated with a second area of the specimen, different from the first area of the specimen, by processing data from a first imaging round of the second area by the charged particle microscope; the second logic is to provide the first data set associated with the second area to the machine-learning computational model to generate predicted values of a set of parameters of the second area; the third logic is to determine whether a second imaging round of the second area is to be performed by the charged particle microscope based on the predicted values of the set of parameters of the second area; and the first logic is to, in response to a determination by the third logic that a second imaging round of the second area is not to be performed, not generate a second data set that includes measured values of the set of parameters of the second area.

Example 17 includes the subject matter of any of Examples 1-16, and further specifies that the third logic is also to determine whether a second imaging round of the area is to be performed by the charged particle microscope based on a probabilistic selection criterion.

Example 18 includes the subject matter of any of Examples 1-17, and further specifies that the fourth logic is to retrain the machine-learning computational model upon accumulation of a threshold number of retraining data sets.

Example 19 includes the subject matter of any of Examples 1-18, and further specifies that the fourth logic is to retrain the machine-learning computational model in response to a retraining command from a user.

Example 20 includes the subject matter of any of Examples 1-19, and further specifies that the fourth logic is to retrain the machine-learning computational model when one or more performance metrics of the machine-learning computational model meet one or more retraining criteria.

Example 21 includes the subject matter of any of Examples 1-20, and further specifies that the first data set includes an image having a lower resolution than an image of the second data set.

Example 22 includes the subject matter of any of Examples 1-21, and further specifies that the set of parameters of the area is a single parameter.

Example 23 includes the subject matter of any of Examples 1-22, and further includes: fifth logic to cause the display, on a display device, of a graphical representation of at least some of the first data set associated with the area.

Example 24 includes the subject matter of any of Examples 1-23, and further includes: fifth logic to cause the display, on the display device, of a graphical representation of at least some of the predicted values of the set of parameters of the area.

Example 25 includes the subject matter of any of Examples 1-24, and further includes: fifth logic to cause the display, on the display device, of a graphical representation of at least some of the measured values of the set of parameters of the area.

Example 26 includes the subject matter of any of Examples 1-25, and further includes: fifth logic to cause the display, on a display device, of a graphical representation of at least some of the first data set associated with the area concurrently with a graphical representation of at least some of the predicted values of the set of parameters of the area.

Example 27 includes the subject matter of any of Examples 1-26, and further includes: fifth logic to cause the display, on a display device, of a graphical representation of at least some of the first data set associated with the area concurrently with a graphical representation of at least some of the predicted values of the set of parameters of the area and a graphical representation of at least some of the measured values of the set of parameters of the area.

Example 28 includes the subject matter of any of Examples 1-27, and further includes: fifth logic to cause the display, on a display device, of a graphical representation of at least some of the first data set associated with the area concurrently with a graphical representation of at least some of the measured values of the set of parameters of the area.

Example 29 includes the subject matter of any of Examples 1-28, and further includes: fifth logic to cause the display, on a display device, of a graphical representation of at least some of the predicted values of the set of parameters of the area concurrently with a graphical representation of at least some of the measured values of the set of parameters of the area.

Example 30 includes the subject matter of any of Examples 1-29, and further includes: fifth logic to cause the display, on a display device, of one or more indicators of one or more performance metrics of the machine-learning computational model.

Example 31 includes the subject matter of any of Examples 1-30, and further specifies that the third logic is to determine whether a second imaging round of the area is to be performed by the charged particle microscope based on the predicted values of the set of parameters of the area by comparing at least some of the predicted values of the set of parameters of the area to one or more selection criteria.

Example 32 includes the subject matter of Example 31, and further specifies that the third logic is to determine whether a second imaging round of the area is to be performed by the charged particle microscope based on the predicted values of the set of parameters of the area by determining that a second imaging round of the area is to be performed when the predicted values of the set of parameters of the area indicates that the area is likely to have good data quality.

Example 33 includes the subject matter of any of Examples 31-32, and further specifies that the third logic is to determine whether a second imaging round of the area is to be performed by the charged particle microscope based on the predicted values of the set of parameters of the area by determining that a second imaging round of the area is to be performed when the predicted values of the set of parameters of the area indicates that the area is likely to have poor data quality.

Example 34 is a charged particle microscope support apparatus, including: first logic to generate a first data set associated with an area of a specimen by processing data from a first imaging round of the area by a charged particle microscope; second logic to provide the first data set associated with the area to a machine-learning computational model to generate predicted values of a set of parameters of the area; wherein the first logic is to generate a second data set associated with the area by processing data from a second imaging round of the area by the charged particle microscope, wherein the second data set includes measured values of the set of parameters of the area; and third logic to cause the display, on a display device, of an indication of a difference between the predicted values of the set of parameters of the area and the measured values of the set of parameters of the area.

Example 35 includes the subject matter of Example 34, and further includes: the charged particle microscope.

Example 36 includes the subject matter of any of Examples 34-35, and further specifies that an acquisition time for the first imaging round is less than an acquisition time for the second imaging round.

Example 37 includes the subject matter of any of Examples 34-36, and further specifies that a radiation dose of the first imaging round is less than a radiation dose of the second imaging round.

Example 38 includes the subject matter of any of Examples 34-37, and further specifies that the machine-learning computational model includes a multi-layer neural network model.

Example 39 includes the subject matter of any of Examples 34-38, and further specifies that: the second logic is to, before providing the first data set associated with the area to the machine-learning computational model to generate predicted values of the set of parameters of the area, provide an other data set to a non-machine-learning computational model to generate predicted values of the set of parameters of an other area of the specimen; and the first logic is to, before generating the first data set, generate the other data set associated with the other area of a specimen by processing data from an imaging round of the other area by the charged particle microscope.

Example 40 includes the subject matter of Example 39, and further specifies that the non-machine-learning computational model includes a linear regression or a histogram binarization.

Example 41 includes the subject matter of any of Examples 34-40, and further specifies that the set of parameters includes a data quality indicator.

Example 42 includes the subject matter of any of Examples 34-41, and further specifies that the set of parameters includes ice thickness.

Example 43 includes the subject matter of any of Examples 34-42, and further specifies that the set of parameters includes a count of elements-of-interest, a level of contamination, an amount of specimen movement, an amount of specimen degradation, or an orientation distribution of elements-of-interest.

Example 44 includes the subject matter of any of Examples 34-43, and further specifies that the second logic is to, before using the machine-learning computational model, initially generate the machine-learning computational model.

Example 45 includes the subject matter of Example 44, and further specifies that the second logic is to initially generate the machine-learning computational model by selecting random values for at least some of parameters of the machine-learning computational model.

Example 46 includes the subject matter of any of Examples 44-45, and further specifies that the second logic is to initially generate the machine-learning computational model by adopting at least some parameters from an other machine-learning computational model.

Example 47 includes the subject matter of Example 46, and further specifies that the specimen includes a first element-of-interest, the other machine-learning computational model is associated with a specimen that includes a second element-of-interest, and the second logic is to generate the initial machine-learning computational model, using a similarity between the first element-of-interest and the second element-of-interest, by adopting at least some parameters from the other machine-learning computational model.

Example 48 includes the subject matter of Example 47, and further specifies that the first element-of-interest is a first protein, the second element-of-interest is a second protein, and the similarity between the first protein and the second protein is a similarity of protein sequences of the first protein and the second protein.

Example 49 includes the subject matter of any of Examples 34-48, and further specifies that the charged particle microscope includes a scanning electron microscope (SEM), a transmission electron microscope (TEM), a scanning transmission electron microscope (STEM), or an ion beam microscope.

Example 50 includes the subject matter of any of Examples 34-49, and further specifies that: the area of the specimen is a first area of the specimen; the first logic is to generate a first data set associated with a second area of the specimen, different from the first area of the specimen, by processing data from a first imaging round of the second area by the charged particle microscope; the second logic is to provide the first data set associated with the second area to the machine-learning computational model to generate predicted values of a set of parameters of the second area; and the first logic is to not generate a second data set that includes measured values of the set of parameters of the second area.

Example 51 includes the subject matter of any of Examples 34-50, and further includes: fourth logic to retrain the machine-learning computational model using the first data set and the second data set.

Example 52 includes the subject matter of Example 51, and further specifies that the fourth logic is to retrain the machine-learning computational model upon accumulation of a threshold number of retraining data sets.

Example 53 includes the subject matter of any of Examples 51-52, and further specifies that the fourth logic is to retrain the machine-learning computational model in response to a retraining command from a user.

Example 54 includes the subject matter of any of Examples 51-53, and further specifies that the fourth logic is to retrain the machine-learning computational model when one or more performance metrics of the machine-learning computational model meet one or more retraining criteria.

Example 55 includes the subject matter of any of Examples 34-54, and further specifies that the first data set includes an image having a lower resolution than an image of the second data set.

Example 56 includes the subject matter of any of Examples 34-55, and further specifies that the set of parameters of the area is a single parameter.

Example 57 includes the subject matter of any of Examples 34-56, and further specifies that the third logic is to cause the display, on a display device, of a graphical representation of at least some of the first data set associated with the area.

Example 58 includes the subject matter of any of Examples 34-57, and further specifies that the third logic to cause the display, on the display device, of a graphical representation of at least some of the predicted values of the set of parameters of the area.

Example 59 includes the subject matter of any of Examples 34-58, and further specifies that the third logic is to cause the display, on the display device, of a graphical representation of at least some of the measured values of the set of parameters of the area.

Example 60 includes the subject matter of any of Examples 34-59, and further specifies that the third logic is to cause the display, on a display device, of a graphical representation of at least some of the first data set associated with the area concurrently with a graphical representation of at least some of the predicted values of the set of parameters of the area.

Example 61 includes the subject matter of any of Examples 34-60, and further specifies that the third logic is to cause the display, on a display device, of a graphical representation of at least some of the first data set associated with the area concurrently with a graphical representation of at least some of the predicted values of the set of parameters of the area and a graphical representation of at least some of the measured values of the set of parameters of the area.

Example 62 includes the subject matter of any of Examples 34-61, and further specifies that the third logic is to cause the display, on a display device, of a graphical representation of at least some of the first data set associated with the area concurrently with a graphical representation of at least some of the measured values of the set of parameters of the area.

Example 63 includes the subject matter of any of Examples 34-62, and further specifies that the indication of a difference between the predicted values of the set of parameters of the area and the measured values of the set of parameters of the area includes a graphical representation of at least some of the predicted values of the set of parameters of the area concurrently with a graphical representation of at least some of the measured values of the set of parameters of the area.

Example 64 includes the subject matter of any of Examples 34-63, and further specifies that the third logic is to cause the display, on a display device, of one or more indicators of one or more performance metrics of the machine-learning computational model.

Example 65 includes the subject matter of any of Examples 34-64, and further includes: fifth logic to determine whether a second imaging round of the area is to be performed by the charged particle microscope based on the predicted values of the set of parameters of the area; wherein the third logic is to generate a second data set associated with the area in response to a determination by the fifth logic that a second imaging round of the area is to be performed.

Example 66 includes the subject matter of Example 65, and further specifies that the fifth logic is also to determine whether a second imaging round of the area is to be performed by the charged particle microscope based on a probabilistic selection criterion.

Example 67 includes the subject matter of any of Examples 65-66, and further specifies that the fifth logic is to determine whether a second imaging round of the area is to be performed by the charged particle microscope based on the predicted values of the set of parameters of the area by comparing at least some of the predicted values of the set of parameters of the area to one or more selection criteria.

Example 68 includes the subject matter of Example 67, and further specifies that the fifth logic is to determine whether a second imaging round of the area is to be performed by the charged particle microscope based on the predicted values of the set of parameters of the area by determining that a second imaging round of the area is to be performed when the predicted values of the set of parameters of the area indicates that the area is likely to have good data quality.

Example 69 includes the subject matter of any of Examples 67-68, and further specifies that the fifth logic is to determine whether a second imaging round of the area is to be performed by the charged particle microscope based on the predicted values of the set of parameters of the area by determining that a second imaging round of the area is to be performed when the predicted values of the set of parameters of the area indicates that the area is likely to have poor data quality.

Example 70 is a charged particle microscope support apparatus, including: first logic to store a first machine-learning computational model in association with a first element-of-interest, wherein the first machine-learning computational model is to receive as input a low-resolution charged particle microscope data set representative of an area of a specimen including the first element-of-interest and to output predicted values of a set of parameters of the area of the specimen including the first element-of-interest; and second logic to receive a user indication of a second element-of-interest, different from the first element-of-interest; wherein the first logic is to use the first machine-learning computational model to generate an initial second machine-learning computational model in association with the second element-of-interest, wherein the second machine-learning computational model is to receive as input a low-resolution charged particle microscope data set representative of an area of a specimen including the second element-of-interest and to output predicted values of the set of parameters of the area of the specimen including the second element-of-interest.

Example 71 includes the subject matter of Example 70, and further specifies that the first logic is to generate the initial second machine-learning computational model by selecting random values for at least some parameters of the first machine-learning computational model.

Example 72 includes the subject matter of any of Examples 70-71, and further specifies that the first logic is to generate the initial second machine-learning computational model by adopting at least some parameters from the first machine-learning computational model.

Example 73 includes the subject matter of Example 72, and further specifies that the first logic is to generate the initial second machine-learning computational model using a similarity between the first element-of-interest and the second element-of-interest.

Example 74 includes the subject matter of Example 73, and further specifies that the first element-of-interest is a first protein, the second element-of-interest is a second protein, and the similarity between the first protein and the second protein is a similarity of protein sequences of the first protein and the second protein.

Example 75 includes the subject matter of any of Examples 70-74, and further includes: third logic to generate a first data set associated with a particular area of the specimen including the second element-of-interest by processing data from a first imaging round of the particular area by a charged particle microscope, wherein the first data set includes a low-resolution charged particle microscope data set representative of the particular area; wherein the first logic is to provide the first data set associated with the particular area to the second machine-learning computational model to generate predicted values of a set of parameters of the particular area; fourth logic to determine whether a second imaging round of the particular area is to be performed by the charged particle microscope based on the predicted values of the set of parameters of the particular area; wherein the third logic is to, in response to a determination by the fourth logic that a second imaging round of the particular area is to be performed, generate a second data set associated with the particular area by processing data from a second imaging round of the particular area by the charged particle microscope, wherein the second data set includes measured values of the set of parameters of the particular area; and fifth logic to retrain the second machine-learning computational model using the first data set and the second data set.

Example 76 includes the subject matter of Example 75, and further specifies that an acquisition time for the first imaging round is less than an acquisition time for the second imaging round.

Example 77 includes the subject matter of any of Examples 75-76, and further specifies that a radiation dose of the first imaging round is less than a radiation dose of the second imaging round.

Example 78 includes the subject matter of any of Examples 75-77, and further specifies that: the first logic is to, before providing the first data set associated with the particular area to the second machine-learning computational model to generate predicted values of the set of parameters of the particular area, provide an other data set to an image processing computational model, different from the machine-learning computational model, to generate predicted values of the set of parameters of an other area of the specimen; and the third logic is to, before generating the first data set, generate the other data set associated with the other area of a specimen by processing data from an imaging round of the other area by the charged particle microscope.

Example 79 includes the subject matter of Example 78, and further specifies that the image processing computational model includes a linear regression or a histogram binarization.

Example 80 includes the subject matter of any of Examples 75-79, and further specifies that: the particular area of the specimen is a first area of the specimen; the third logic is to generate a first data set associated with a second area of the specimen, different from the first area of the specimen, by processing data from a first imaging round of the second area by the charged particle microscope; the first logic is to provide the first data set associated with the second area to the second machine-learning computational model to generate predicted values of a set of parameters of the second area; the fourth logic is to determine whether a second imaging round of the second area is to be performed by the charged particle microscope based on the predicted values of the set of parameters of the second area; and the third logic is to, in response to a determination by the fourth logic that a second imaging round of the second area is not to be performed, not generate a second data set that includes measured values of the set of parameters of the second area.

Example 81 includes the subject matter of any of Examples 75-80, and further specifies that the fourth logic is also to determine whether a second imaging round of the second area is to be performed by the charged particle microscope based on a probabilistic selection criterion.

Example 82 includes the subject matter of any of Examples 75-81, and further specifies that the fifth logic is to retrain the second machine-learning computational model upon accumulation of a threshold number of retraining data sets.

Example 83 includes the subject matter of any of Examples 75-82, and further specifies that the fifth logic is to retrain the second machine-learning computational model in response to a retraining command from a user.

Example 84 includes the subject matter of any of Examples 75-83, and further specifies that the fifth logic is to retrain the second machine-learning computational model when one or more performance metrics of the second machine-learning computational model meet one or more retraining criteria.

Example 85 includes the subject matter of any of Examples 74-83, and further specifies that the first data set includes an image having a lower resolution than an image of the second data set.

Example 86 includes the subject matter of any of Examples 75-85, and further specifies that the set of parameters of the area is a single parameter.

Example 87 includes the subject matter of any of Examples 75-86, and further specifies that the second logic is to cause the display, on a display device, of a graphical representation of at least some of the first data set associated with the particular area.

Example 88 includes the subject matter of any of Examples 75-87, and further specifies that the second logic is to cause the display, on the display device, of a graphical representation of at least some of the predicted values of the set of parameters of the particular area.

Example 89 includes the subject matter of any of Examples 75-88, and further specifies that the second logic is to cause the display, on the display device, of a graphical representation of at least some of the measured values of the set of parameters of the particular area.

Example 90 includes the subject matter of any of Examples 75-89, and further specifies that the second logic is to cause the display, on a display device, of a graphical representation of at least some of the first data set associated with the particular area concurrently with a graphical representation of at least some of the predicted values of the set of parameters of the particular area.

Example 91 includes the subject matter of any of Examples 75-90, and further specifies that the second logic is to cause the display, on a display device, of a graphical representation of at least some of the first data set associated with the particular area concurrently with a graphical representation of at least some of the predicted values of the set of parameters of the particular area and a graphical representation of at least some of the measured values of the set of parameters of the particular area.

Example 92 includes the subject matter of any of Examples 75-91, and further specifies that the second logic is to cause the display, on a display device, of a graphical representation of at least some of the first data set associated with the particular area concurrently with a graphical representation of at least some of the measured values of the set of parameters of the particular area.

Example 93 includes the subject matter of any of Examples 75-92, and further specifies that the second logic is to cause the display, on a display device, of a graphical representation of at least some of the predicted values of the set of parameters of the particular area concurrently with a graphical representation of at least some of the measured values of the set of parameters of the particular area.

Example 94 includes the subject matter of any of Examples 75-93, and further specifies that the second logic is to cause the display, on a display device, of one or more indicators of one or more performance metrics of the second machine-learning computational model.

Example 95 includes the subject matter of any of Examples 75-94, and further specifies that the fourth logic is to determine whether a second imaging round of the particular area is to be performed by the charged particle microscope based on the predicted values of the set of parameters of the particular area by comparing at least some of the predicted values of the set of parameters of the particular area to one or more selection criteria.

Example 96 includes the subject matter of Example 95, and further specifies that the fourth logic is to determine whether a second imaging round of the particular area is to be performed by the charged particle microscope based on the predicted values of the set of parameters of the particular area by determining that a second imaging round of the particular area is to be performed when the predicted values of the set of parameters of the particular area indicates that the particular area is likely to have good data quality.

Example 97 includes the subject matter of any of Examples 95-96, and further specifies that the fourth logic is to determine whether a second imaging round of the particular area is to be performed by the charged particle microscope based on the predicted values of the set of parameters of the particular area by determining that a second imaging round of the particular area is to be performed when the predicted values of the set of parameters of the particular area indicates that the particular area is likely to have poor data quality.

Example 98 includes the subject matter of any of Examples 70-97, and further includes: the charged particle microscope.

Example 99 includes the subject matter of any of Examples 70-98, and further specifies that the second machine-learning computational model includes a multi-layer neural network model.

Example 100 includes the subject matter of any of Examples 70-99, and further specifies that the set of parameters includes a data quality indicator.

Example 101 includes the subject matter of any of Examples 70-100, and further specifies that the set of parameters includes ice thickness.

Example 102 includes the subject matter of any of Examples 70-101, and further specifies that the set of parameters includes a count of elements-of-interest, a level of contamination, an amount of specimen movement, an amount of specimen degradation, or an orientation distribution of elements-of-interest.

Example A includes any of the CPM support modules disclosed herein.

Example B includes any of the methods disclosed herein.

Example C includes any of the GUIs disclosed herein.

Example D includes any of the CPM support computing devices and systems disclosed herein.

The invention claimed is:

1. A charged particle microscope support apparatus, comprising:
    first logic to generate a first data set associated with a first area of a specimen by processing data from a first imaging round of the first area by a charged particle microscope;
    second logic to provide the first data set associated with the first area to a machine-learning computational model to generate predicted values of a set of parameters of the first area;
    third logic to determine whether a second imaging round of the first area is to be performed by the charged particle microscope based on the predicted values of the set of parameters of the first area;
    wherein the first logic is to, in response to a determination by the third logic that a second imaging round of the first area is to be performed, generate a second data set associated with the first area by processing data from a second imaging round of the first area by the charged particle microscope, wherein the second data set includes measured values of the set of parameters of the first area; and
    fourth logic to retrain the machine-learning computational model using the first data set associated with the first area and the second data set associated with the first area,
    wherein the first logic is to generate a first data set associated with a second area of the specimen, different from the first area of the specimen, by processing data from a first imaging round of the second area by the charged particle microscope,
    wherein the second logic is to provide the first data set associated with the second area to the machine-learning computational model to generate predicted values of a set of parameters of the second area, and
    wherein the first logic is to not generate a second data set that includes measured values of the set of parameters of the second area.

2. The charged particle microscope support apparatus of claim 1, wherein an acquisition time for the first imaging round is less than an acquisition time for the second imaging round.

3. The charged particle microscope support apparatus of claim 1, wherein a radiation dose of the first imaging round is less than a radiation dose of the second imaging round.

4. The charged particle microscope support apparatus of claim 1, wherein:
    the second logic is to, before providing the first data set associated with the first area to the machine-learning computational model to generate the predicted values of the set of parameters of the first area, generate predicted values of a set of parameters of an other area of the specimen by providing an other data set associated with the other area to an image processing computational model, different from the machine-learning computational model, to generate predicted values of the set of parameters of the other area of the specimen; and
    the first logic is to, before generating the first data set associated with the first area, generate the other data set associated with the other area of a specimen by processing data from an imaging round of the other area by the charged particle microscope.

5. The charged particle microscope support apparatus of claim 4, wherein the image processing computational model includes a linear regression or a histogram binarization.

6. The charged particle microscope support apparatus of claim 1, wherein the set of parameters includes a data quality indicator.

7. The charged particle microscope support apparatus of claim 1, wherein the set of parameters includes ice thickness.

8. The charged particle microscope support apparatus of claim 1, wherein the set of parameters includes a count of elements-of-interest, a level of contamination, an amount of specimen movement, an amount of specimen degradation, or an orientation distribution of elements-of-interest.

9. A charged particle microscope support apparatus, comprising:
    first logic to generate a first data set associated with an area of a specimen by processing data from a first imaging round of the area by a charged particle microscope;
    second logic to provide the first data set associated with the area to a machine-learning computational model to generate predicted values of a set of parameters of the area;
    wherein the first logic is to generate a second data set associated with the area by processing data from a second imaging round of the area by the charged particle microscope, wherein the second data set includes measured values of the set of parameters of the area; and
    third logic to cause the display, on a display device, of a plurality of graphical labels overlayed onto an image, wherein each graphical label corresponds to a region of the area and graphically depicts a difference between a corresponding one of the predicted values of the region and a corresponding one of the measured values of the region.

10. The charged particle microscope support apparatus of claim 9, wherein:
the area of the specimen is a first area of the specimen;
the first logic is to generate a first data set associated with a second area of the specimen, different from the first area of the specimen, by processing data from a first imaging round of the second area by the charged particle microscope;
the second logic is to provide the first data set associated with the second area to the machine-learning computational model to generate predicted values of a set of parameters of the second area; and
the first logic is to not generate a second data set that includes measured values of the set of parameters of the second area.

11. The charged particle microscope support apparatus of claim 9, further comprising:
fourth logic to retrain the machine-learning computational model using the first data set and the second data set.

12. The charged particle microscope support apparatus of claim 9, wherein the first data set includes a first image having a lower resolution than a second image of the second data set.

13. The charged particle microscope support apparatus of claim 9, wherein the third logic is to cause the display, on a display device, of a graphical representation of at least some of the first data set associated with the area.

14. The charged particle microscope support apparatus of claim 9, wherein the third logic to cause the display, on the display device, of a graphical representation of at least some of the predicted values of the set of parameters of the area.

15. The charged particle microscope support apparatus of claim 9, wherein the third logic is to cause the display, on the display device, of a graphical representation of at least some of the measured values of the set of parameters of the area.

16. The charged particle microscope support apparatus of claim 9, wherein the third logic is to cause the display, on a display device, of one or more indicators of one or more performance metrics of the machine-learning computational model.

17. A charged particle microscope support apparatus, comprising:
first logic to store a first machine-learning computational model in association with a first element-of-interest, wherein the first machine-learning computational model is to receive as input a low-resolution charged particle microscope data set representative of an area of a specimen including the first element-of-interest and to output predicted values of a set of parameters of the area of the specimen including the first element-of-interest; and
second logic to receive a user indication of a second element-of-interest, different from the first element-of-interest;
wherein the first logic is to use the first machine-learning computational model to generate an initial second machine-learning computational model in association with the second element-of-interest, wherein the initial second machine-learning computational model is to receive as input a low-resolution charged particle microscope data set representative of an area of a specimen including the second element-of-interest and to output predicted values of the set of parameters of the area of the specimen including the second element-of-interest.

18. The charged particle microscope support apparatus of claim 17, wherein the first logic is to generate the initial second machine-learning computational model by adopting at least some parameters from the first machine-learning computational model.

19. The charged particle microscope support apparatus of claim 18, wherein the first logic is to generate the initial second machine-learning computational model using a similarity between the first element-of-interest and the second element-of-interest.

20. The charged particle microscope support apparatus of claim 19, wherein the first element-of-interest is a first protein, the second element-of-interest is a second protein, and the similarity between the first protein and the second protein is a similarity of protein sequences of the first protein and the second protein.

21. The charged particle microscope support apparatus of claim 9, wherein each graphical label comprises a first indicator representing the corresponding one of the predicted values of the region and a second indicator representing the corresponding one of the measured values of the region.

* * * * *